(12) United States Patent
Hato

(10) Patent No.: US 7,449,769 B2
(45) Date of Patent: Nov. 11, 2008

(54) SUPERCONDUCTING SYSTEM, SUPERCONDUCTING CIRCUIT CHIP, AND HIGH-TEMPERATURE SUPERCONDUCTING JUNCTION DEVICE WITH A SHUNT RESISTOR

(75) Inventor: Tsunehiro Hato, Kawasaki (JP)

(73) Assignees: Fujitsu Limited, Kawasaki (JP); International Superconductivity Technology Center, The Juridical Foundation, Tokyo (JP)

( * ) Notice: Subject to any disclaimer, the term of this patent is extended or adjusted under 35 U.S.C. 154(b) by 0 days.

(21) Appl. No.: 11/442,427

(22) Filed: May 30, 2006

(65) Prior Publication Data

US 2007/0069339 A1    Mar. 29, 2007

Related U.S. Application Data

(62) Division of application No. 10/793,936, filed on Mar. 8, 2004, now Pat. No. 7,075,171.

(30) Foreign Application Priority Data

Mar. 11, 2003  (JP) .............................. 2003-064937
Jul. 29, 2003  (JP) .............................. 2003-202817

(51) Int. Cl.
*H01L 39/00* (2006.01)

(52) U.S. Cl. ........................... 257/662; 257/31; 257/34; 257/663; 257/E39.015; 257/E27.007

(58) Field of Classification Search ................. 257/662, 257/E39.015

See application file for complete search history.

(56) References Cited

U.S. PATENT DOCUMENTS 4,859,879 A    8/1989  Przybysz ..................... 307/476

(Continued)

FOREIGN PATENT DOCUMENTS

JP    4-45612    2/1992

(Continued)

OTHER PUBLICATIONS

Patent Abstracts of Japan, 2000-353831, Dec. 19, 2000, 2 pages.

(Continued)

*Primary Examiner*—Tu-Tu V Ho
(74) *Attorney, Agent, or Firm*—Kratz, Quintos & Hanson, LLP

(57) ABSTRACT

A superconducting system that includes an interface circuit capable of making the best use of a high-speed superconducting circuit and a high-speed semiconductor circuit. A multi-chip module in which an Nb superconducting circuit having Josephson junctions formed by the use of Nb and an oxide high-temperature superconducting latch interface circuit having Josephson junctions formed by the use of an oxide high-temperature superconductor are connected is located in a low temperature environment kept at 4.2 K. The oxide high-temperature superconducting latch interface circuit is connected to a high-speed semiconductor amplifier and a signal outputted from the Nb superconducting circuit is transmitted to the high-speed semiconductor amplifier. As a result, the limit of the operation speed of the oxide high-temperature superconducting latch interface circuit is raised and the superconducting system including the interface circuit capable of making the best use of both the high-speed Nb superconducting circuit and the high-speed semiconductor amplifier is realized.

2 Claims, 21 Drawing Sheets

U.S. PATENT DOCUMENTS 5,939,730 A * 8/1999 Durand et al. ................. 257/31
6,476,413 B1 * 11/2002 Jia et al. ....................... 257/33

FOREIGN PATENT DOCUMENTS

JP          2000-353831        12/2000

OTHER PUBLICATIONS

Patent Abstracts of Japan, 2001-244511, Sep. 7, 2001, 2 pages.
Japanese Office Action dated Apr. 15, 2008, with partial English translation.

* cited by examiner

SUPERCONDUCTING SYSTEM, SUPERCONDUCTING CIRCUIT CHIP, AND HIGH-TEMPERATURE SUPERCONDUCTING JUNCTION DEVICE WITH A SHUNT RESISTOR

CROSS-REFERENCE TO RELATED APPLICATIONS

This application is a divisional application of U.S. patent application Ser. No. 10/793,936, filed Mar. 8, 2004, now U.S. Pat. No. 7,075,171, which application is based upon and claims the benefits of priority from the prior Japanese Patent Applications No. 2003-64937, filed on Mar. 11, 2003, and No. 2003-202817, filed on Jul. 29, 2003, the entire contents of which are incorporated herein by reference.

BACKGROUND OF THE INVENTION (1) Field of the Invention

The present invention relates to a superconducting system and a superconducting circuit chip and, more particularly, to a superconducting system for transmitting a signal outputted from a superconducting circuit to another circuit via an interface circuit and a superconducting circuit chip including such a superconducting circuit and interface circuit. Furthermore, this invention relates to a high-temperature superconducting junction device with a shunt resistor and, more particularly, to a high-temperature superconducting junction device with a shunt resistor for optimally driving a ramp-edge high-temperature superconducting junction included in a superconducting circuit.

(2) Description of the Related Art

Among superconducting circuits, single flux quantum (SFQ) circuits which operate with an SFQ pulse as an information carrier are characterized by ultrahigh speed and low energy. Accordingly, it is expected that these SFQ circuits will be components in future high-speed information processing systems. To build a high-speed information processing system using such an SFQ circuit, a superconducting system for taking a signal out of the SFQ circuit and for transmitting the signal at a high speed to a semiconductor device which is in an environment kept at room temperature must be developed. However, this SFQ circuit operates at a voltage of about several hundred microvolts, so it cannot drive the semiconductor device directly. Therefore, an interface circuit must be located between the SFQ circuit and the semiconductor device to amplify the signal taken out of the SFQ circuit to about several tens of millivolts so that the semiconductor device can be driven.

FIG. 19 shows an example of the structure of a conventional superconducting system in which a metal superconductor is used. A conventional superconducting system 100 includes a chip 101 on which an Nb superconducting circuit and an Nb latch interface circuit, for example, are formed. This chip 101 is located in an environment kept at a liquid helium temperature (4.2 K) by a refrigerator. The Nb superconducting circuit is an SFQ circuit having a Josephson junction formed by the use of Nb, being a metal superconductor. Like the Nb superconducting circuit, the Nb latch interface circuit is a latch driver as an interface circuit having a Josephson junction formed by the use of Nb. The Nb latch interface circuit is connected to a high-speed semiconductor amplifier 102 and the high-speed semiconductor amplifier 102 is connected to a semiconductor circuit 103. A signal in the Nb superconducting circuit usually has a voltage of about several hundred microvolts and the Nb superconducting circuit should be connected to a comparatively high-speed and high input sensitivity semiconductor amplifier. Accordingly, a semiconductor circuit, such as a GaAs heterojunction bipolar transistor (HBT) which can operate at an input voltage of 6 mV at a speed of 10 Gbps, will be used as the high-speed semiconductor amplifier 102.

Techniques for fabricating a superconducting circuit included in such a superconducting system have advanced. An Nb superconducting circuit having several thousands of junctions has already been fabricated on an experimental basis.

Moreover, an attempt to use an oxide high-temperature superconductor, such as YBaCuO, which produces a superconductive phenomenon even at a higher temperature in a superconducting system in place of a metal superconductor like the one described above has been made. In this case, a superconducting circuit and an interface circuit included in a superconducting system include Josephson junctions formed by the use of an oxide high-temperature superconductor (see, for example, Japanese Unexamined Patent Publication No. 2000-353831). Oxide high-temperature superconductors represented by yttrium-based superconductors go into a superconductive state at temperatures higher than the liquid helium temperature, so in recent years cooling mechanisms have been simplified compared with conventional metal superconductors which involve cooling by liquid helium. Accordingly, it is expected that such oxide high-temperature superconductors will widely be applied to sensors, logic circuits, and the like.

In these oxide high-temperature superconductors, a superconducting current has the property of being able to flow along a Cu—O plane in a crystal made up of Cu and O, so a junction should cross in a direction parallel to this Cu—O plane. Accordingly, ramp-edge junctions have been proposed as superconducting junctions used in high-temperature superconducting devices. Such ramp-edge junctions are of two types (see, for example, Japanese Unexamined Patent Publication No. 2001-244511). With ramp-edge junctions of one type, a barrier layer is formed by a deposited film. With ramp-edge junctions of the other type, a barrier layer is formed by modifying the property of a surface by ion irradiation. A surface-modified ramp-edge junction will now be described with reference to FIG. 20.

FIG. 20A is a rough perspective view of a conventional surface-modified ramp-edge junction. First, a lower electrode 202 of La-doped YBCO ($YBa_2Cu_3O_{7-x}$) and an insulating layer 203 of $SrSnO_3$ which will be an interlayer dielectric are deposited in order on an MgO substrate 201 by pulse laser deposition. Then a resist pattern (not shown) is formed by coating resist and patterning (exposure and development). Ion milling is performed by irradiating with Ar ions with this resist pattern as a mask to form a ramp-edge structure.

Then the ramp-edge portion is irradiated again with Ar ions to form a damaged layer 204 as a barrier layer. An upper electrode 205 of YBCO is deposited by pulse laser deposition. After that, ion milling is performed to form a ramp climbing portion 206. As a result, the basic structure of a ramp-edge junction is completed.

FIG. 20B shows the volt-ampere characteristic of the ramp-edge junction. As shown in FIG. 20B, the ramp-edge junction exhibits an overdamp characteristic. That is to say, unlike an Nb superconducting junction which operates at a low temperature, hysteresis in the volt-ampere characteristic is sufficiently small.

Among superconducting circuits including such a ramp-edge junction, SFQ circuits have the property of operating at ultrahigh speeds with a small amount of energy. To design and fabricate an SFQ circuit with an oxide high-temperature superconductor, it is necessary to meet the condition that in a superconducting loop including a ramp-edge junction, or a Josephson junction, in the circuit, the product (L×$I_c$ product) of the inductance L of the loop and a critical current $I_c$ for the Josephson junction should be equal to one quantum flux ($\Phi_0$ or $\Phi_0/2$.

In this case, if critical current density $J_c$ for the junction used in the SFQ circuit is increased, then the product ($I_c$ $R_n$ product) of the critical current $I_c$ and normal conduction resistance $R_n$ increases. Therefore, it is said that the width of an SFQ pulse given by $\tau = \Phi_0/(I_c R_n)$ ($\Phi = 2.07 \times 10^{-15}$ wb) becomes narrower and that the SFQ circuit can operate at a higher speed.

As stated above, the hysteresis in the volt-ampere characteristic of the ramp-edge junction is sufficiently small, so the ramp-edge junction is used in an SFQ circuit without making any changes. Accordingly, no consideration has been given to the structure of a ramp-edge junction in which shunting is performed with a resistor.

By the way, if the Nb superconducting circuit (currently, techniques for fabricating Nb superconducting circuits are more advanced than techniques for fabricating superconducting circuits including an oxide high-temperature superconductor) and the Nb latch interface circuit (as an interface circuit between the Nb superconducting circuit and the semiconductor circuit) having a Josephson junction formed by the use of Nb are used for building a superconducting system, there is a limit to the operation speed of the superconducting system due to the punch through probability, CR time constant, etc., of the Josephson junction.

For example, current density for the Josephson junction formed by the use of Nb widely used at present is 2.5 kA/cm². In this case, the operation speed of the Nb latch interface circuit is, at the most, about 8 Gbps due to the punch through. Consideration has been given to increasing the current density to 10 kA/cm². However, even if this value is realized, the operation speed of the Nb latch interface circuit is, at the most, about 20 Gbps. If the high-speed semiconductor amplifier operates at a speed of 40 Gbps, high operation speeds of the Nb superconducting circuit and the semiconductor circuit will be limited by this Nb latch interface circuit.

As described above, the performance of the Nb latch interface circuit is not yet adequate enough to serve as an interface circuit between the Nb superconducting circuit and a semiconductor circuit. It is hoped that an interface circuit capable of making the best use of not only high operation speeds of Nb superconducting circuits including a large number of Josephson junctions but also high operation speeds of semiconductor circuits will be developed.

As stated above, with a superconducting system in which an oxide high-temperature superconductor is used, it is said that in a ramp-edge type SFQ circuit fabricated by the use of the oxide high-temperature superconductor, an increase in critical current density $J_c$ for the ramp-edge junction will lead to a decrease in the width of an SFQ pulse and that the SFQ circuit can operate at a high speed. According to a further study by the present inventor, however, an increase in the critical current density $J_c$ leads to a significant increase in the hysteresis. Such an increase in the hysteresis tends to decrease a bias margin for the SFQ circuit. When the hysteresis exceeds 10%, it is difficult for the SFQ circuit to operate. If the SFQ circuit is complex, it cannot operate.

FIG. 21 is a view for describing the dependence of an $I_c$—$R_n$ product and hysteresis for a conventional high-temperature superconducting ramp-edge junction on critical current density $J_c$. An $I_c$—$R_n$ product is proportional to the 0.3rd power of the critical current density $J_c (I_c \times R_n J_c^{0.3})$. The McCumber parameter $\beta_c$, being one of the parameters indicative of the hysteresis, is expressed by the following formula (1). That is to say, an increase in the critical current density $J_c$ leads to a steep increase in the hysteresis.

$$\beta_c \propto J_c^{0.3}/[\ln(a) - \ln(Jc)] \qquad (1)$$

where ln means a logarithm, and a is a physical quantity including the barrier height of the junction and is expressed by the following formula (2).

$$a = (4\pi \in_0 \in_r /h) \times (2 \, m\Phi)^{1/2} \qquad (2)$$

where $\in_r$ is a barrier relative dielectric constant, $\in_0$ is the permittivity of free space, h is plank's constant, m is the mass of an electron, and $\Phi$ is the barrier height.

SUMMARY OF THE INVENTION

The present invention was made under the background circumstances described above. An object of the present invention is to provide a superconducting system including an interface circuit which can transmit a signal outputted from a superconducting circuit to another circuit at a high speed, which has sufficient amplification capability, and which hardly malfunctions.

Another object of the present invention is to provide a superconducting circuit chip where an interface circuit which can transmit a signal outputted from a superconducting circuit to another circuit at a high speed, which has sufficient amplification capability, and which hardly malfunctions and the superconducting circuit are formed.

Still another object of the present invention is to enable stable operation of a superconducting circuit having a ramp-edge junction in the case of using an oxide high-temperature superconductor in a superconducting system or a superconducting circuit chip.

In order to achieve the first object, a superconducting system for transmitting a signal outputted from a superconducting circuit to another circuit via an interface circuit is provided. This superconducting system comprises a low-temperature superconducting circuit having Josephson junctions formed by the use of a metal superconductor and an interface circuit having Josephson junctions formed by the use of an oxide high-temperature superconductor and connected to the low-temperature superconducting circuit.

In order to achieve the second object, a superconducting circuit chip comprising a low-temperature superconducting circuit and an interface circuit for transmitting a signal outputted from the superconducting circuit to another circuit is provided. In this superconducting circuit chip, the low-temperature superconducting circuit includes Josephson junctions formed by the use of a metal superconductor and the interface circuit includes Josephson junctions formed by the use of an oxide high-temperature superconductor and is connected to the low-temperature superconducting circuit.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 20A is a rough perspective view of a conventional surface-modified ramp-edge junction, while

DESCRIPTION OF THE PREFERRED EMBODIMENTS

Embodiments of the present invention will now be described in detail with reference to the drawings.

First of all, superconducting systems for transmitting a signal outputted from a superconducting circuit to another circuit via an interface circuit, according to first to fourth embodiments of the present invention will be described.

The first embodiment will be described first.

Figure 1:
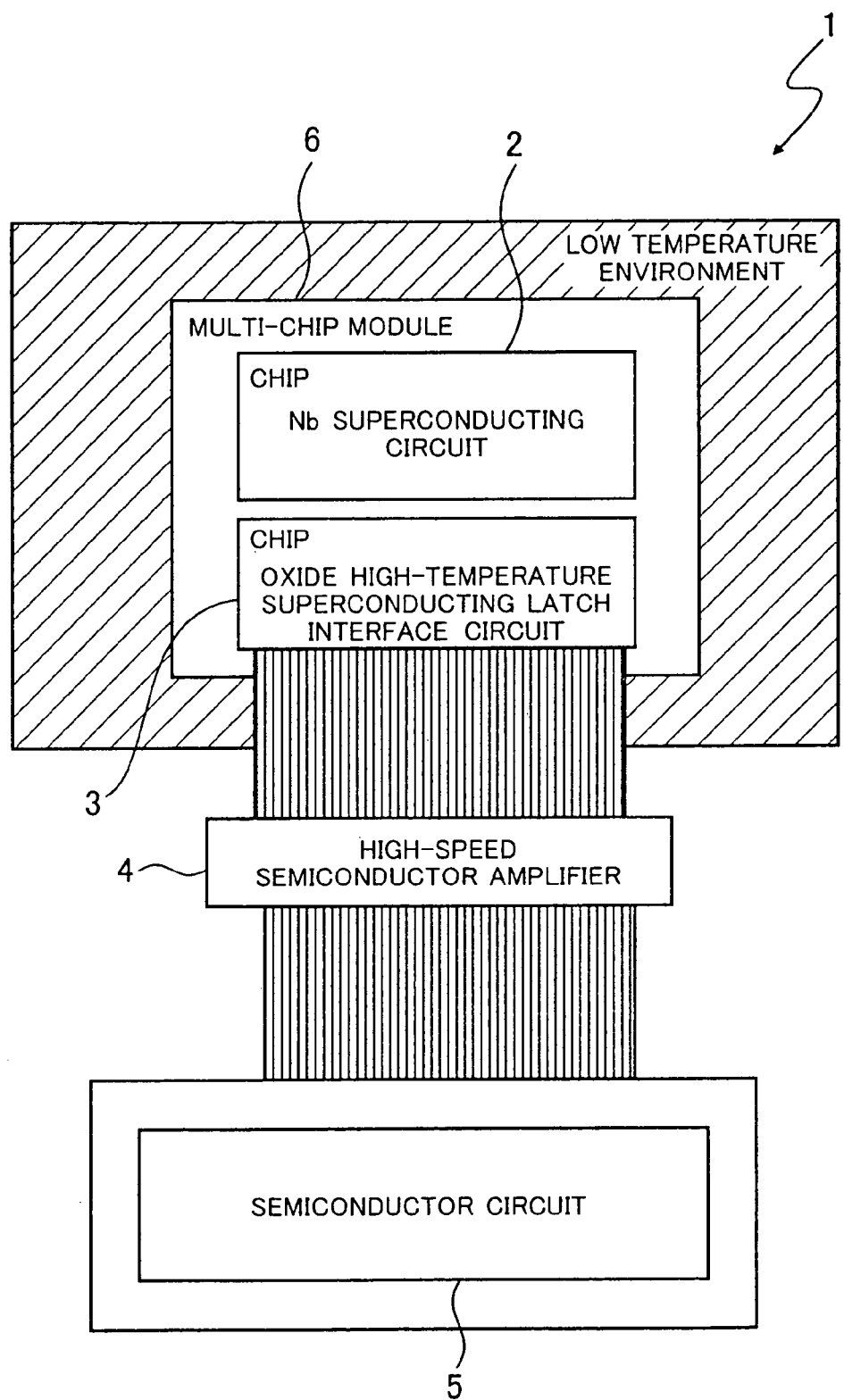
FIG. 1 shows the structure of a superconducting system according to a first embodiment of the present invention.

FIG. 1 shows the structure of a superconducting system according to the first embodiment of the present invention. A superconducting system 1 shown in FIG. 1 comprises an Nb superconducting circuit 2, being a low-temperature superconducting circuit formed by the use of Nb, and an oxide high-temperature superconducting latch interface circuit 3, being a latch driver formed by the use of an oxide high-temperature superconductor. The Nb superconducting circuit 2 is an SFQ circuit having a Josephson junction formed by the use of Nb. The oxide high-temperature superconducting latch interface circuit 3 is an interface circuit having a Josephson junction formed by the use of an oxide high-temperature superconductor having composition, such as YBaCuO, YbBaCuO, DyBaCuO, ErBaCuO, HoBaCuO, or NdBaCuO. The Nb superconducting circuit 2 and the oxide high-temperature superconducting latch interface circuit 3 are in a low temperature environment kept at, for example, the liquid helium temperature (4.2 K) by a refrigerator or the like (not shown).

The superconducting system 1 further comprises a high-speed semiconductor amplifier 4 which is connected to the oxide high-temperature superconducting latch interface circuit 3 and which is in a room temperature environment and a semiconductor circuit 5 which is connected to the high-speed semiconductor amplifier 4 and which is in a room temperature environment. For example, a GaAs—HBT which can operate at an input voltage of 6 mV at a speed of 10 Gbps may be used as the high-speed semiconductor amplifier 4. For 40 Gbps operation, a tandem-amplifier structure with a InP—HEMT analogue amplifier and a InP—HEMT digital amplifier is useful as the semiconductor amplifier. One of various semiconductor circuits mounted in devices may be used as the semiconductor circuit 5.

In the superconducting system 1, the Nb superconducting circuit 2 and the oxide high-temperature superconducting latch interface circuit 3 are formed on different substrates and are included in different chips. These chips are mounted on an assembly chip, for example, and the Nb superconducting circuit 2 and the oxide high-temperature superconducting latch interface circuit 3 are connected. A multi-chip module 6, being a superconducting circuit chip, is formed in this way. The multi-chip module 6 in the superconducting system 1 is in a low temperature environment.

Figure 2:
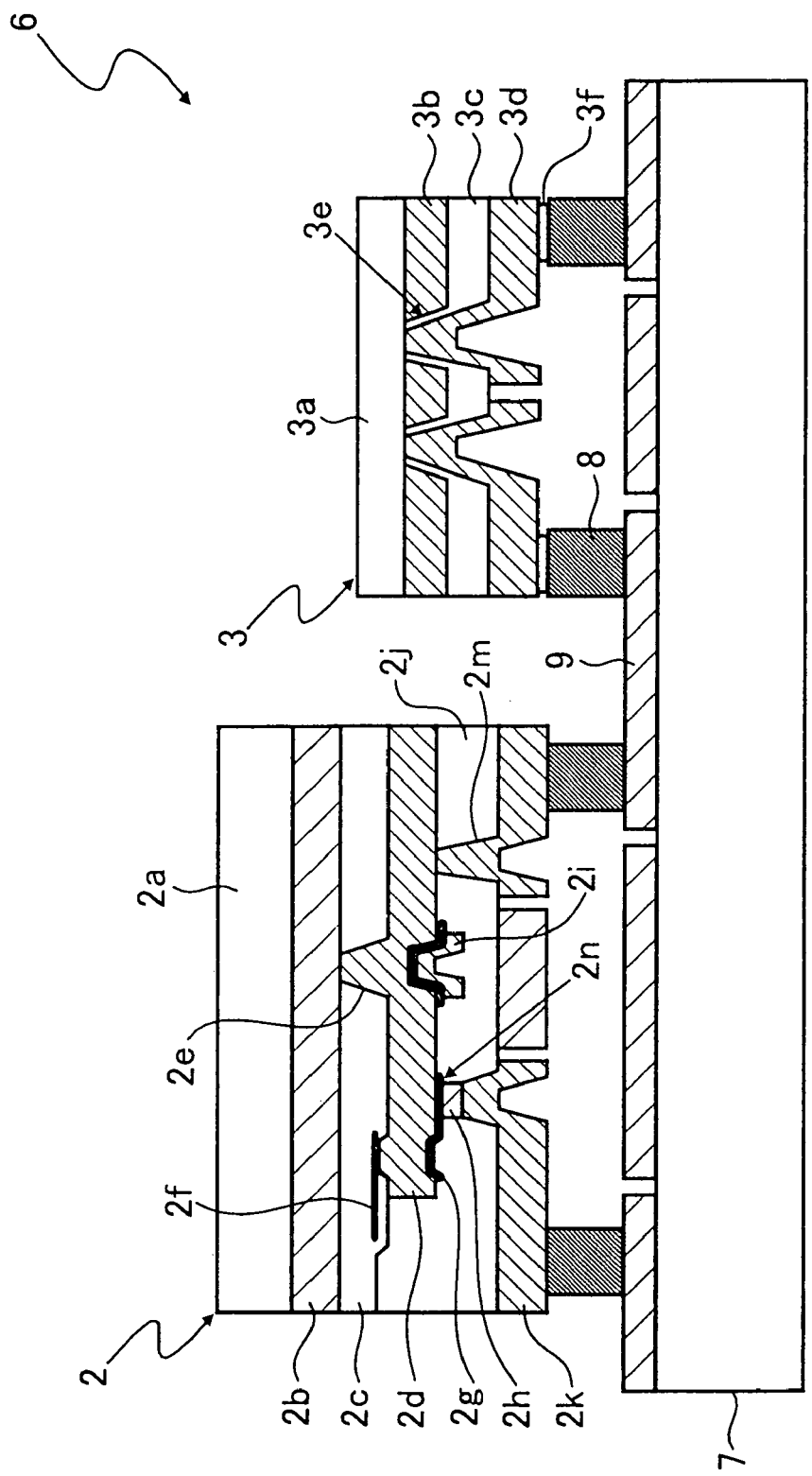
FIG. 2 is a simplified sectional view of the multi-chip module in the superconducting system according to the first embodiment of the present invention.

FIG. 2 is a simplified sectional view of the multi-chip module in the superconducting system according to the first embodiment of the present invention. Components in FIG. 2 which are the same as those shown in FIG. 1 are marked with the same symbols and detailed descriptions of them will be omitted.

As shown in FIG. 2, the Nb superconducting circuit 2 and the oxide high-temperature superconducting latch interface circuit 3 are mounted over an assembly chip 7 with superconductive solder bumps 8 between.

In the Nb superconducting circuit 2 shown in FIG. 2, a ground plane 2b of Nb and an interlayer dielectric 2c of $SiO_2$ are formed in order on a silicon substrate 2a. A base electrode 2d of Nb is formed on the interlayer dielectric 2c. The ground plane 2b and the base electrode 2d are connected by a ground contact 2e which penetrates the interlayer dielectric 2c. A sheet resistor 2f of Mo is located in the interlayer dielectric 2c and is connected to the base electrode 2d. A counter electrode 2h of Nb and a protection layer 2i of Nb are formed over the base electrode 2d with junction barriers 2g of Al—$AlO_x$ between. The protection layer 2i is located for preventing the ground contact 2e from being disconnected. An interlayer dielectric 2j of $SiO_2$ and a counter electrode 2k of Nb are formed on the base electrode 2d, the counter electrode 2h, and the protection layer 2i. The counter electrode 2k and the base electrode 2d are connected by a base contact 2m. Moreover, the counter electrode 2k is formed so that it will be connected to the counter electrode 2h beneath it. A Josephson junction 2n is made up of the base electrode 2d, the junction barrier 2g, and the counter electrodes 2h and 2k.

In the oxide high-temperature superconducting latch interface circuit 3 shown in FIG. 2, a base electrode 3b which is made of La-doped YBaCuO$_x$ and in which two holes are made is formed on an MgO substrate 3a. A counter electrode 3d of YbBaCuO$_x$ is formed over the base electrode 3b with an interlayer dielectric 3c of SrSnO$_x$ between. Josephson junctions 3e made up of the base electrode 3b, the counter electrode 3d, and the interlayer dielectric 3c between them are formed at the hole portions in the base electrode 3b. Pads 3f which are made of Au and which are connected to the superconductive solder bumps 8 are formed on the counter electrode 3d.

The Nb superconducting circuit 2 and the oxide high-temperature superconducting latch interface circuit 3 are connected to a superconductive wiring 9 which is made of Nb and which is formed on the assembly chip 7 via the superconductive solder bumps 8. As a result, the multi-chip module 6 in which Josephson transmission lines (JTLs) in the Nb superconducting circuit 2 and the oxide high-temperature superconducting latch interface circuit 3 are connected by a passive transmission line (PTL) is formed.

In the superconducting system 1 according to the first embodiment of the present invention, the Nb superconducting circuit 2 and the oxide high-temperature superconducting latch interface circuit 3 are connected in the multi-chip module and are located in a low temperature environment kept at, for example, 4.2 K. By locating both the low-temperature superconducting circuit formed by the use of a metal superconductor and the interface circuit formed by the use of an oxide high-temperature superconductor in a certain low temperature environment in this way, the limit of the operation speed of the interface circuit in the superconducting system can be raised.

For example, at 4.2 K at which the Nb superconducting circuit 2 operates, the limit of the operation speed of the oxide high-temperature superconducting latch interface circuit 3 formed by the use of a Y-based oxide high-temperature superconductor is about 50 Gbps due to the punch through. This result eventuates from the difference in characteristic between the Josephson junction formed by the use of Nb and the Josephson junction formed by the use of an oxide high-temperature superconductor. A high-critical current density of 60 Ka/cm$^2$ is easily obtained by the use of a Y-based oxide high-temperature superconductor.

Furthermore, the temperature of an environment in which the oxide high-temperature superconducting latch interface circuit 3 in the superconducting system 1 is located is lower than a temperature at which it can usually operate. Generally there must be hysteresis in the volt-ampere (V-I) characteristic of an interface circuit located between an SFQ circuit and a semiconductor circuit. This hysteresis becomes more significant at a lower temperature. Therefore, to reduce the probability that the interface circuit will malfunction, it is preferable that the oxide high-temperature superconducting latch interface circuit 3, together with the Nb superconducting circuit 2, should be made to operate in a low temperature environment.

As stated above, the superconducting system 1 including the interface circuit capable of making the best use of both the high-speed Nb superconducting circuit 2 and the high-speed semiconductor amplifier 4 can be realized. In addition, by adopting such a multi-tip module, a circuit in which a metal superconductor is used and a circuit in which an oxide high-temperature superconductor is used can be formed separately. This reduces the burdens on circuit fabrication processes.

A Josephson junction in the Nb superconducting circuit 2 is not limited to the one shown in FIG. 2. Moreover, the structure of the Nb superconducting circuit 2 shown in FIG. 2 is a simple example and of course an Nb superconducting circuit having another structure may be used in the superconducting system 1. Furthermore, a Josephson junction in the oxide high-temperature superconducting latch interface circuit 3 is not limited to the one shown in FIG. 2. The structure of the oxide high-temperature superconducting latch interface circuit 3 shown in FIG. 2 is a simple example and of course an oxide high-temperature superconducting latch interface circuit having another structure may be used in the superconducting system 1.

In FIG. 2, the Nb superconducting circuit 2 and the oxide high-temperature superconducting latch interface circuit 3 are connected by the Nb superconductive wiring 9 formed on the assembly chip 7. However, both circuits may be connected not by the superconductive wiring 9 but by a JTL formed by the use of Nb. In this case, the JTL in the Nb superconducting circuit 2, the JTL formed on the assembly chip 7, and the JTL in the oxide high-temperature superconducting latch interface circuit 3 will be connected.

The second embodiment will now be described.

Figure 3:
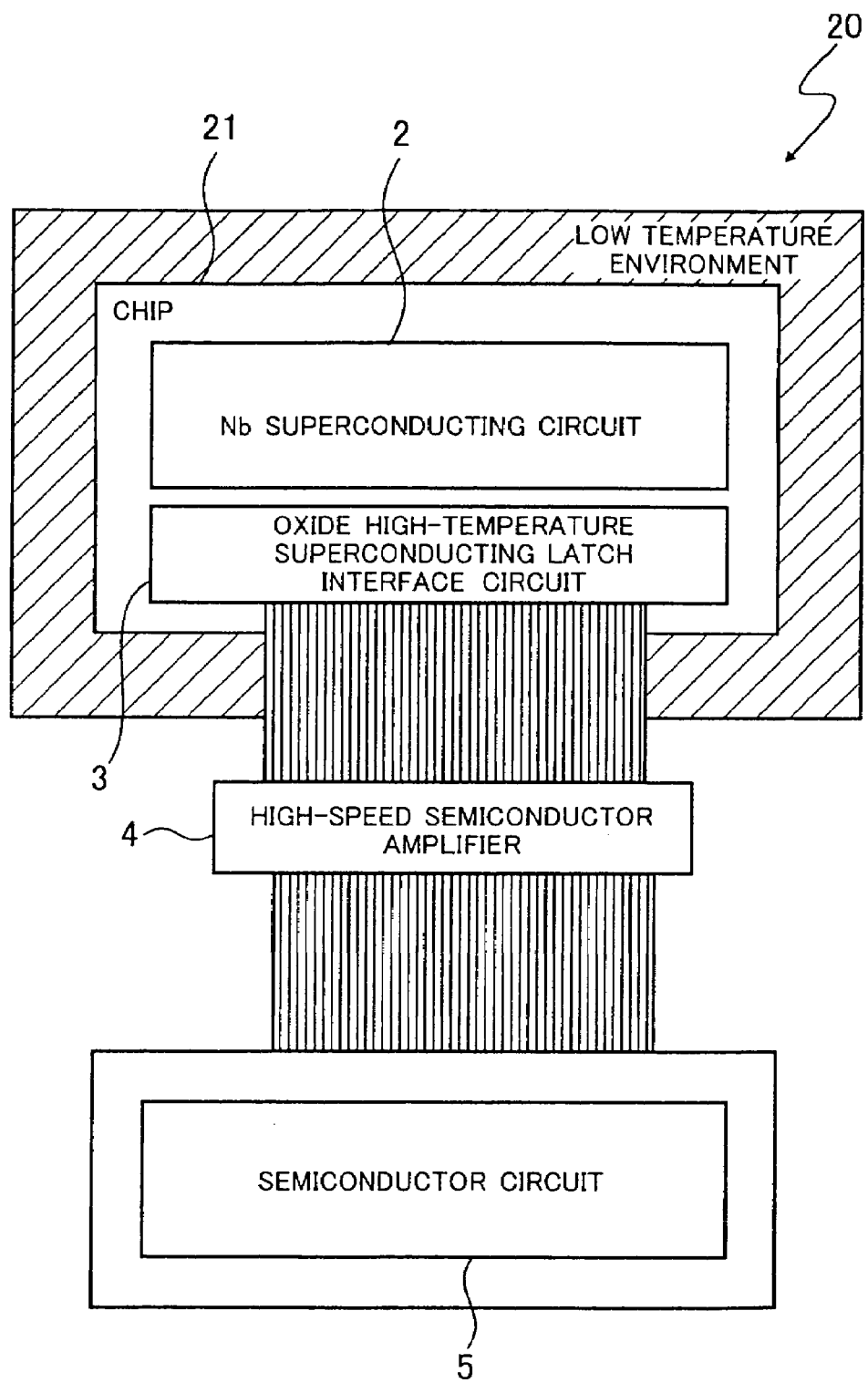
FIG. 3 shows the structure of a superconducting system according to a second embodiment of the present invention.

FIG. 3 shows the structure of a superconducting system according to the second embodiment of the present invention. Components in FIG. 3 which are the same as those shown in FIG. 1 are marked with the same symbols and detailed descriptions of them will be omitted.

A superconducting system 20 according to the second embodiment of the present invention differs from the superconducting system 1 according to the first embodiment of the present invention in that an Nb superconducting circuit 2 and an oxide high-temperature superconducting latch interface circuit 3 are formed on the same substrate, that is to say, in that there is only one superconducting circuit chip 21. The rest of the structure of the superconducting system 20 is the same as that of the superconducting system 1. In addition, the function and effect of the superconducting system 20 are the same as those of the superconducting system 1. That is to say, the chip 21 on which the Nb superconducting circuit 2 and the oxide high-temperature superconducting latch interface circuit 3 are formed is located in a low temperature environment, so the limit of the operation speed of the interface circuit is raised. As a result, the superconducting system 20 including the oxide high-temperature superconducting latch interface circuit 3 capable of making the best use of the high-speed Nb superconducting circuit 2 and a high-speed semiconductor amplifier 4 is realized.

When the Nb superconducting circuit 2 and the oxide high-temperature superconducting latch interface circuit 3 are formed on the same substrate, the oxide high-temperature superconducting latch interface circuit 3 which requires a high temperature process should be formed prior to the formation of the Nb superconducting circuit 2.

The third embodiment will now be described.

Figure 4:
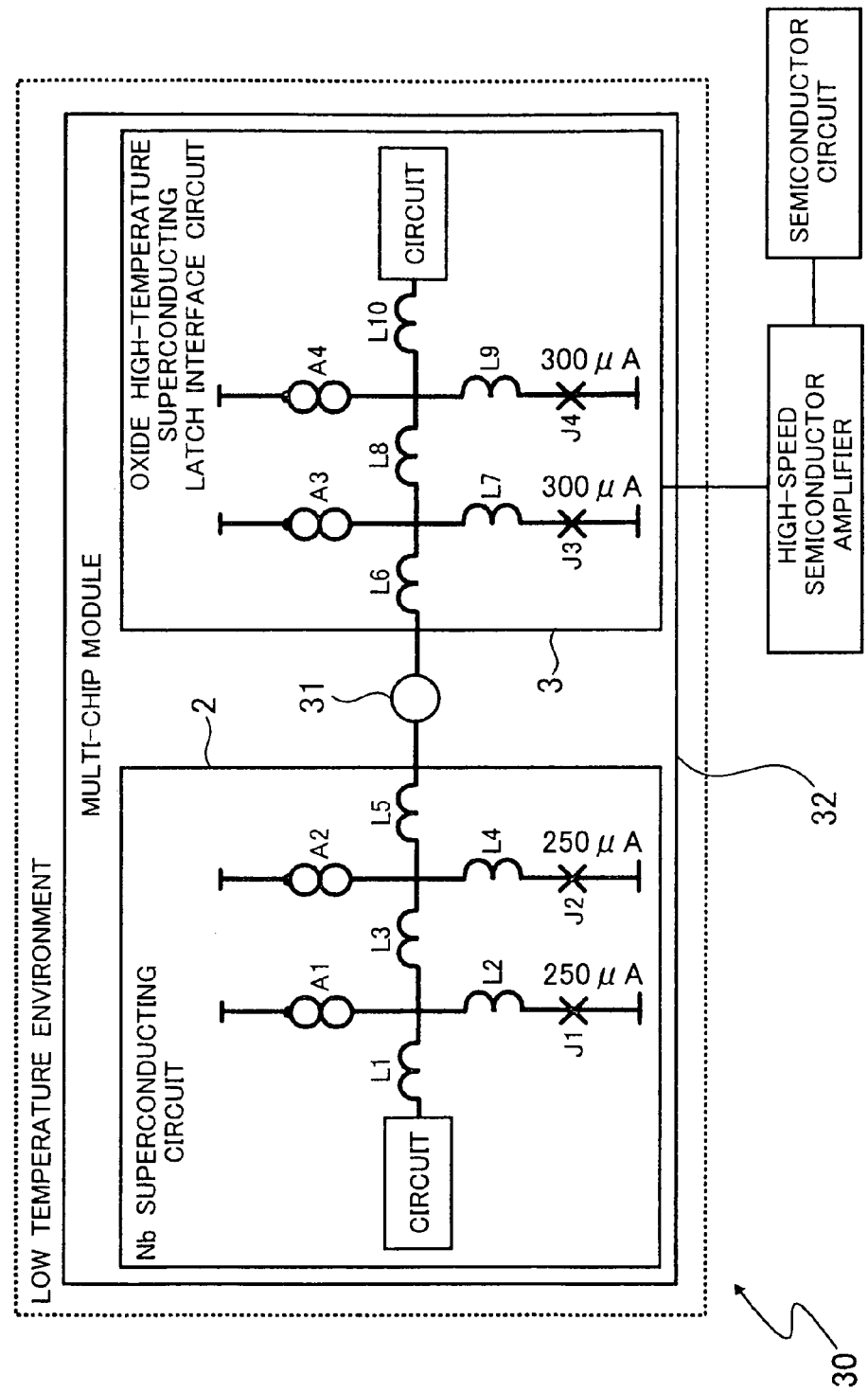
FIG. 4 shows the structure of a superconducting system according to a third embodiment of the present invention.

FIG. 4 shows the structure of a superconducting system according to the third embodiment of the present invention. Components in FIG. 4 which are the same as those shown in FIG. 1 are marked with the same symbols and detailed descriptions of them will be omitted.

In a superconducting system 30 according to the third embodiment of the present invention, an Nb superconducting circuit 2 and an oxide high-temperature superconducting latch interface circuit 3 are not connected by a wiring, such as a PTL or a JTL. JTLs in both circuits are connected via a superconductive solder bump 31 and these circuits make up a multi-chip module 32. In the superconducting system 30, the Nb superconducting circuit 2 and the oxide high-temperature superconducting latch interface circuit 3 connected by the bump in this way are located in a low temperature environment. The rest of the structure of the superconducting system 30 is the same as that of the superconducting system 1 according to the first embodiment of the present invention.

In FIG. 4, J1 and J2 are Josephson junctions on the JTL in the Nb superconducting circuit 2 and J3 and J4 are Josephson junctions on the JTL in the oxide high-temperature superconducting latch interface circuit 3. L1, L2, L3, L4, and L5 indicate inductor portions in the Nb superconducting circuit 2 and L6, L7, L8, L9, and L10 indicate inductor portions in the oxide high-temperature superconducting latch interface circuit 3. A1, A2, A3, and A4 are bias current sources for J1, J2, J3, and J4 respectively. The superconductive solder bump 31 should include a resistance component lower than or equal to 10 Ω and an inductance component lower than or equal to 10 pH so that an SFQ pulse outputted from the Nb superconducting circuit 2 can be transmitted fully to the oxide high-temperature superconducting latch interface circuit 3. In the superconducting system 30 shown in FIG. 4, a critical current ($I_c$) for each of the Josephson junctions J1 and J2 in the Nb superconducting circuit 2 is 250 μA and a critical current ($I_c$) for each of the Josephson junctions J3 and J4 in the oxide high-temperature superconducting latch interface circuit 3 is 300 μA.

With the superconducting system 30 having such a structure, the structure of the multi-chip module 32 is simplified and miniaturization, high-speed transmission, a reduction in the probability of malfunction, etc. can be realized.

Figure 5:
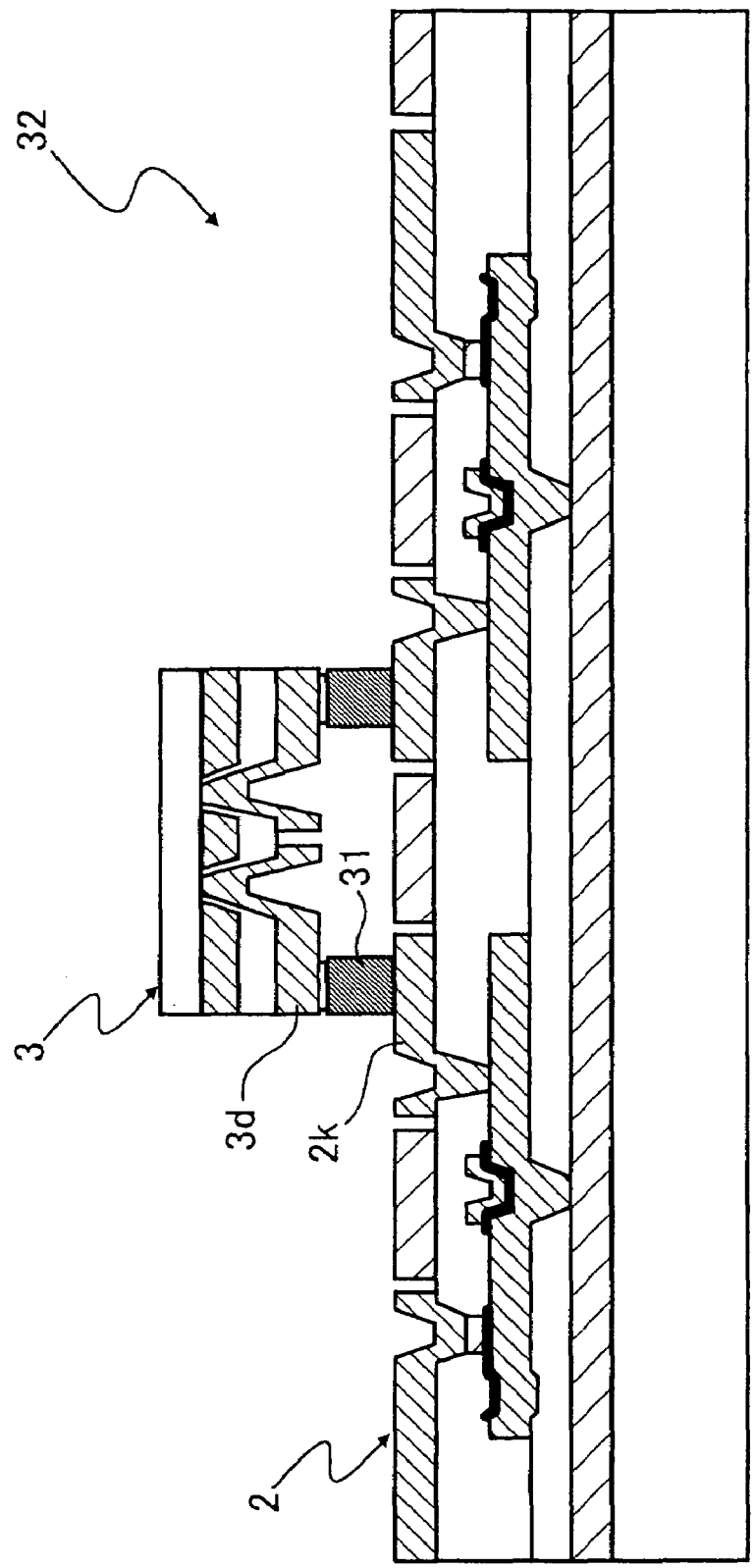
FIG. 5 is a simplified sectional view of the multi-chip module in the superconducting system according to the third embodiment of the present invention.

FIG. 5 is a simplified sectional view of the multi-chip module in the superconducting system according to the third embodiment of the present invention. Components in FIG. 5 which are the same as those shown in FIG. 2 are marked with the same symbols and detailed descriptions of them will be omitted.

In the multi-chip module 32 shown in FIG. 5, a counter electrode 2k on the Nb superconducting circuit 2 and a counter electrode 3d on the oxide high-temperature superconducting latch interface circuit 3 are connected via the superconductive solder bump 31. As a result, the JTL in the Nb superconducting circuit 2 and the JTL in the oxide high-temperature superconducting latch interface circuit 3 will be combined.

Each Josephson junction in the Nb superconducting circuit 2 is not limited to the one shown in FIG. 5. Moreover, the structure of the Nb superconducting circuit 2 shown in FIG. 5 is a simple example and of course an Nb superconducting circuit having another structure may be used in the superconducting system 30. Furthermore, each Josephson junction in the oxide high-temperature superconducting latch interface circuit 3 is not limited to the one shown in FIG. 5. The structure of the oxide high-temperature superconducting latch interface circuit 3 shown in FIG. 5 is a simple example and of course the oxide high-temperature superconducting latch interface circuit 3 having another structure may be used in the superconducting system 30.

A superconducting system according to the fourth embodiment of the present invention will now be described.

Figure 6:
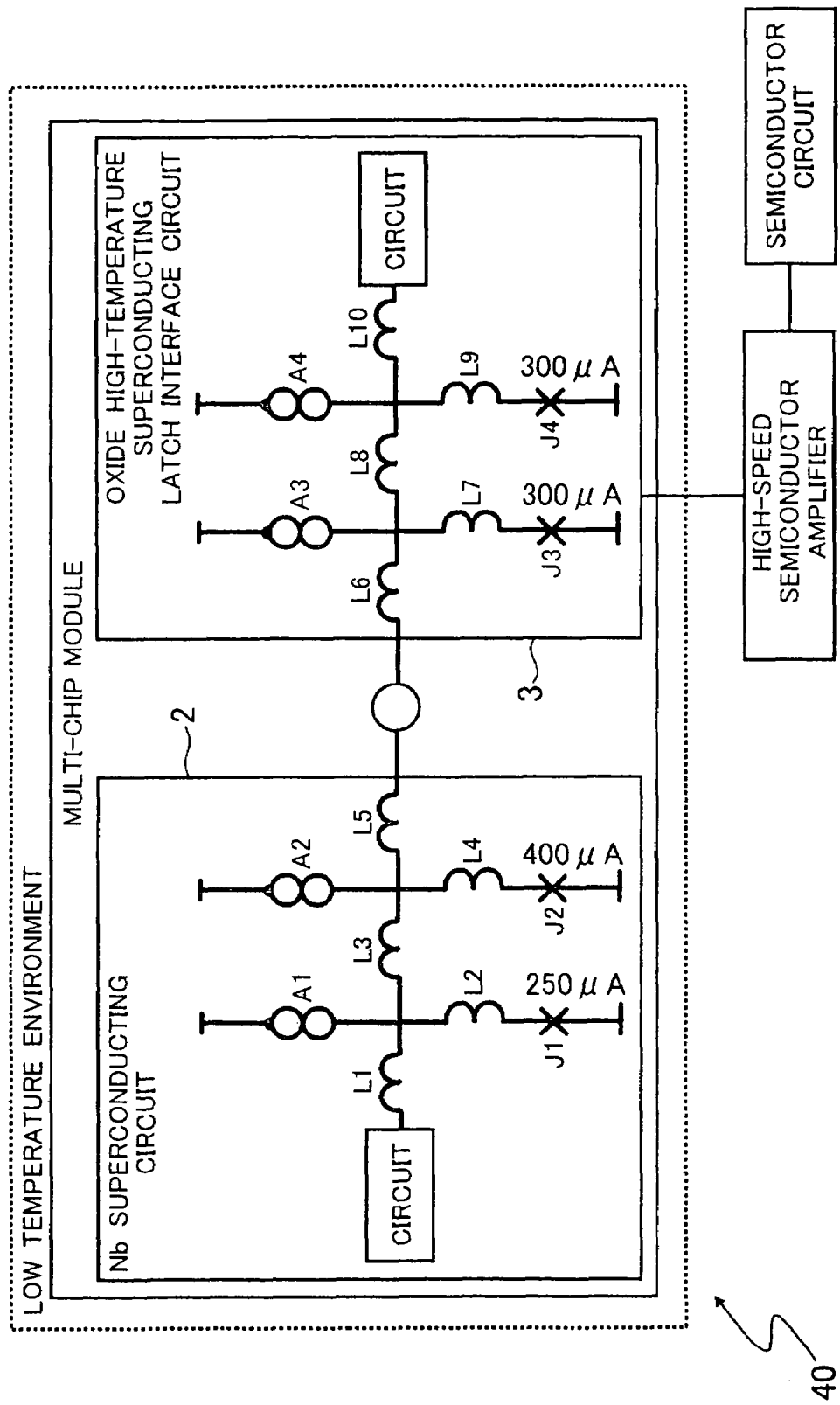
FIG. 6 shows the structure of a superconducting system according to a fourth embodiment of the present invention.

FIG. 6 shows the structure of a superconducting system according to the fourth embodiment of the present invention. Components in FIG. 6 which are the same as those shown in FIG. 4 are marked with the same symbols and detailed descriptions of them will be omitted.

A superconducting system 40 according to the fourth embodiment of the present invention differs from the superconducting system 30 according to the third embodiment of the present invention in that $I_c$ for a Josephson junction in an Nb superconducting circuit 2 nearest an oxide high-temperature superconducting latch interface circuit 3 is set to a value greater than the value of $I_c$ for a Josephson junction in the oxide high-temperature superconducting latch interface circuit 3 nearest the Nb superconducting circuit 2. That is to say, $I_c$ for a Josephson junction J2 at the last stage on a JTL in the Nb superconducting circuit 2 nearest the oxide high-temperature superconducting latch interface circuit 3 is set to a value greater than the value of $I_c$ for a Josephson junction J3 at the first stage on a JTL in the oxide high-temperature superconducting latch interface circuit 3 where a signal outputted from the Nb superconducting circuit 2 reaches first. In this case, $I_c$ for the Josephson junction J2 is set to a value one and a tenth to one and a half times the value of $I_c$ for the Josephson junction J3. The rest of the structure of the superconducting system 40 is the same as that of the superconducting system 30 according to the third embodiment of the present invention.

In the Nb superconducting circuit 2 in the superconducting system 40 shown in FIG. 6, $I_c$ for a Josephson junction J1 is 250 μA and $I_c$ for the Josephson junction J2 is 400 μA. In the oxide high-temperature superconducting latch interface circuit 3, $I_c$ for the Josephson junction J3 and a Josephson junction J4 are 300 μA. That is to say, in this example, $I_c$ for the Josephson junction J2 is about one and three-tenths times $I_c$ for the Josephson junction J3.

By setting $I_c$ for the Josephson junction J2 to a great value in this way, the following effect will be obtained. When an SFQ pulse outputted from the Nb superconducting circuit 2 is transmitted to the oxide high-temperature superconducting latch interface circuit 3, the attenuated pulse may return from the oxide high-temperature superconducting latch interface circuit 3 to the Nb superconducting circuit 2. Even in this case, such a pulse is prevented from entering the Nb superconducting circuit 2 because $I_c$ for the Josephson junction J2 is set to a great value. Accordingly, the switching of the Josephson junction J2 by this pulse is prevented and the probability of malfunction can be reduced.

As stated above, $I_c$ for the Josephson junction J2 at the last stage in the Nb superconducting circuit 2 is set to a value one and a tenth to one and a half times the value of $I_c$ for the Josephson junction J3 at the first stage in the oxide high-temperature superconducting latch interface circuit 3. If $I_c$ for the Josephson junction J2 is set to a value smaller than one and a tenth times the value of $I_c$ for the Josephson junction J3, the pulse which may return to the Nb superconducting circuit 2 is not prevented effectively from entering the Nb superconducting circuit 2. On the other hand, if $I_c$ for the Josephson junction J2 is set to a value greater than one and a half times the value of $I_c$ for the Josephson junction J3, the SFQ pulse to be transmitted from the Nb superconducting circuit 2 to the oxide high-temperature superconducting latch interface circuit 3 may not be transmitted.

To set $I_c$ for the Josephson junction J2 in this way, the size (area) of the Josephson junction J2 is made larger than that of the Josephson junction J1 at the design and fabrication stage of the Nb superconducting circuit 2. With the superconducting system 40 shown in FIG. 6, for example, $I_c$ for the Josephson junction J1 is 250 μA and $I_c$ for the Josephson junction J3 is 300 μA. Therefore, to set $I_c$ for the Josephson junction J2 to 400 μA, the Nb superconducting circuit 2 should be designed and fabricated so that the area of the Josephson junction J2 will be one and three-fifths times that of the Josephson junction J1.

On the JTL in the Nb superconducting circuit 2, Josephson junctions $I_c$ for which is one and a tenth to one and a half times $I_c$ for the Josephson junction J3 at the first stage in the oxide high-temperature superconducting latch interface circuit 3 may be located not only at the last stage but also at another stage. Furthermore, such a Josephson junction may be located only at a stage other than the last stage if the Nb superconducting circuit 2 has the necessary characteristics.

In the superconducting system 1 according to the first embodiment or the superconducting system 20 according to the second embodiment, $I_c$ for, at the least, a Josephson junction at the last stage in the Nb superconducting circuit 2 may be set to a value greater than that of $I_c$ for a Josephson junction at the first stage in the oxide high-temperature superconducting latch interface circuit 3. This is the same with the superconducting system 40 according to the fourth embodiment. Moreover, if the Nb superconducting circuit 2 and the oxide high-temperature superconducting latch interface circuit 3 are connected by a JTL formed on an assembly chip 7, $I_c$ for, at the least, a Josephson junction at the last stage in the JTL should be set to a value one and a tenth to one and a half times that of $I_c$ for the Josephson junction at the first stage in the oxide high-temperature superconducting latch interface circuit 3.

As has been described in the foregoing, in the superconducting systems 1, 20, 30, and 40 for transmitting a signal outputted from the Nb superconducting circuit 2 to the high-speed semiconductor amplifier 4 or the like via a interface circuit, the oxide high-temperature superconducting latch interface circuit 3 formed by the use of an oxide high-temperature superconductor is used as this interface circuit. The Nb superconducting circuit 2 and the oxide high-temperature superconducting latch interface circuit 3 are located in a low temperature environment kept at, for example, 4.2 K. By doing so, the superconducting systems 1, 20, 30, and 40 each including the interface circuit which can make the best use of the high-speed Nb superconducting circuit 2 and the high-speed semiconductor amplifier 4, which has sufficient amplification capability, and which hardly malfunctions can be realized.

By using these superconducting system 1, 20, 30, and 40, ultrahigh-speed data transmission can be performed with a small amount of energy. Therefore, they can widely be used in the fields of communication, computer, instrumentation, etc. as, for example, communication routers, servers, A/D converters, fluxmeters (SQUIDs), and samplers.

In the above descriptions, a metal superconductor is not limited to Nb and another metal (or compound) superconductor or alloy superconductor may be used. Moreover, an oxide high-temperature superconductor may be used.

A superconducting junction device including a superconducting junction will now be described.

It is assumed that a ramp-edge junction is formed especially by the use of an oxide high-temperature superconductor in a superconducting system like those described above. Then hysteresis can be made smaller by shunting the ramp-edge junction formed by the use of the oxide high-temperature superconductor. This makes a superconducting circuit operate stably, compared with a case where the ramp-edge junction is not shunted.

Figure 7:
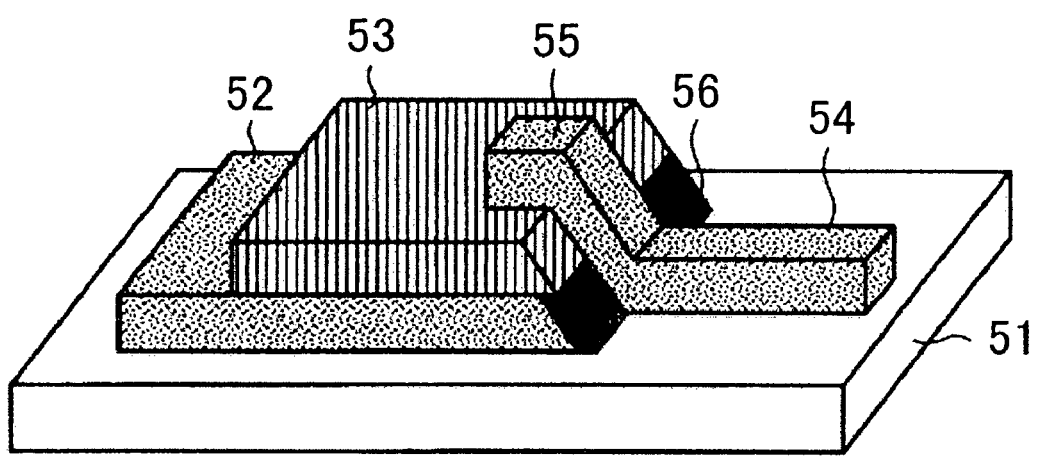
FIG. 7 shows the basic structure of a high-temperature superconducting junction device with a shunt resistor.
Figure 8:
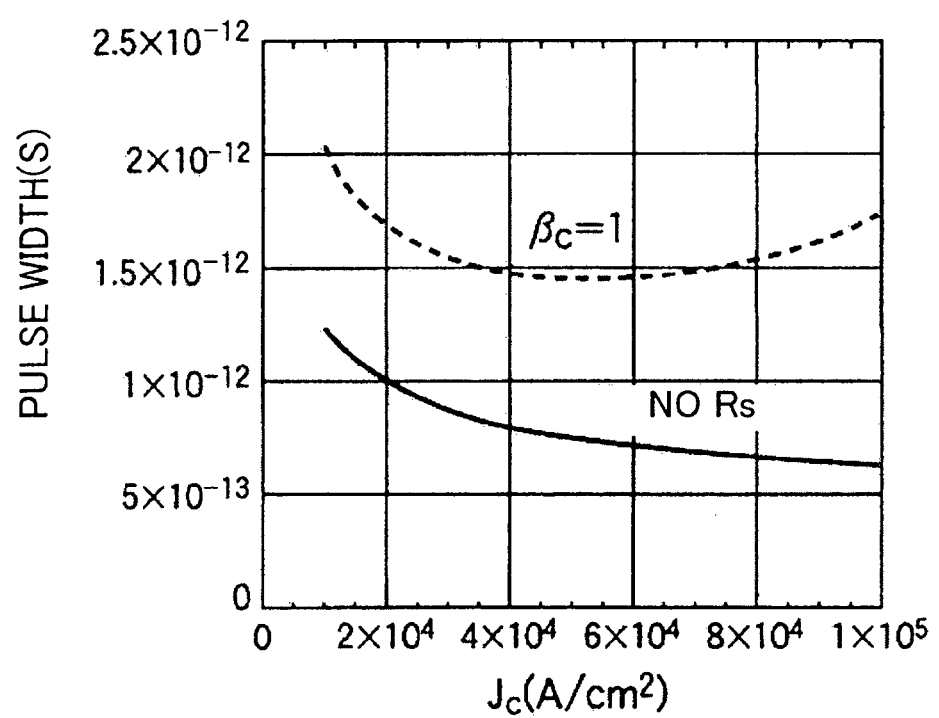
FIG. 8 is a view for describing the dependence of the width of an SFQ pulse on critical current density at 4.2 K.
Figure 9:
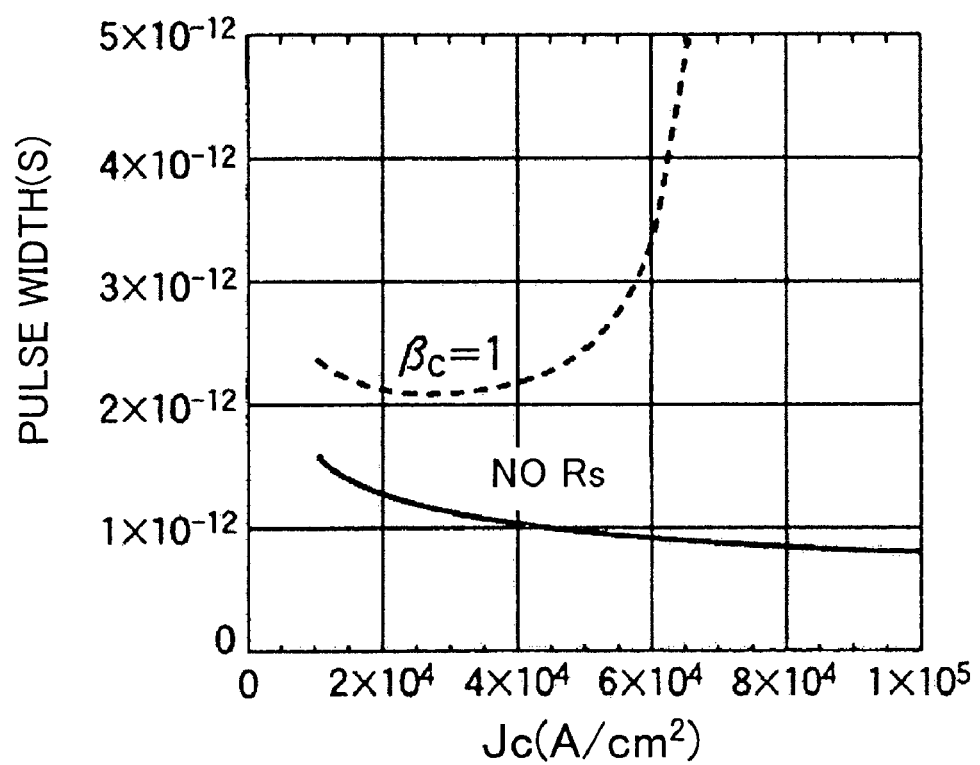
FIG. 9 is a view for describing the dependence of the width of an SFQ pulse on critical current density at 30 K.
Figure 10:
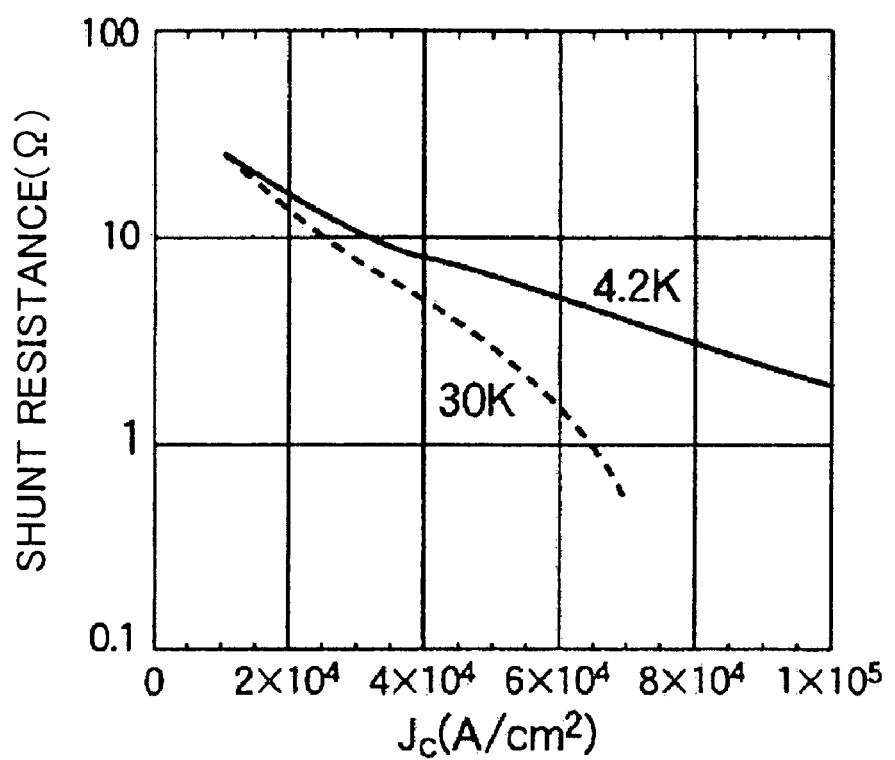
FIG. 10 is a view for describing the dependence of a shunt resistance value which makes hysteresis zero on critical current density.

FIG. 7 shows the basic structure of a high-temperature superconducting junction device with a shunt resistor. FIGS. 8 and 9 are views for describing the dependence of the width of an SFQ pulse on critical current density $J_c$. FIG. 10 is a view for describing the dependence of a shunt resistance value which makes hysteresis zero on critical current density $J_c$.

In a superconducting system in which an oxide high-temperature superconductor is used, a superconducting circuit including a ramp-edge junction should operate stably. Therefore, in a high-temperature superconducting junction device according to the present invention, a conductive interlayer 53 is formed between a ramp climbing portion 55 of an upper electrode 54 and a lower electrode 52 which make up a ramp-edge junction, as shown in FIG. 7. By forming the conductive interlayer 53 in this way, the ramp-edge junction is shunted. As a result, hysteresis becomes smaller (zero in an ideal case). This enables the superconducting circuit, such as an SFQ circuit, to operate stably. Furthermore, if the hysteresis is kept zero, that is to say, the McCumber parameter $\beta_c$ is kept one by shunt resistance, the optimum value of critical current density $J_c$ which makes the operation speed of the circuit highest exists. Therefore, by optimizing critical current density $J_c$, the circuit can operate at a higher speed.

FIG. 8 is a view for describing the dependence of the width of an SFQ pulse on critical current density $J_c$ at 4.2 K. If shunt resistance $R_s$ does not exist, the width of an SFQ pulse narrows with an increase in the critical current density $J_c$. If $\beta_c=1$, it can be understood that there is a critical current density value $J_c$ that minimizes the width of an SFQ pulse. That is to say, an optimum critical current density value $J_c$ for high-speed operation exists.

FIG. 9 is a view for describing the dependence of the width of an SFQ pulse on critical current density $J_c$ at 30 K. If the shunt resistance $R_s$ does not exist, the width of an SFQ pulse narrows with an increase in the critical current density $J_c$. If $\beta_c=1$, it can be understood that there is a critical current density value $J_c$ that minimizes the width of an SFQ pulse and that the width of an SFQ pulse widens rapidly with an increase in the critical current density $J_c$.

FIG. 10 is a view for describing the dependence of a shunt resistance value which makes hysteresis zero ($\beta_c=1$) on critical current density $J_c$. A shunt resistance value which makes hysteresis zero becomes smaller with an increase in the critical current density $J_c$. The shunt resistance reduces more greatly at a higher temperature.

If the conductive interlayer 53 is formed between the ramp climbing portion 55 of the upper electrode 54 and the lower electrode 52, seen from above the conductive interlayer 53 and the ramp climbing portion 55 of the upper electrode 54 should have the same shape to set a shunt resistance value with great accuracy.

Another method for shunting the ramp-edge junction is to connect the ramp climbing portion 55 of the upper electrode 54 and the lower electrode 52 by a resistance layer formed on a slant of an interlayer insulating layer opposite to the surface of the interlayer insulating layer where the upper electrode 54 is joined. In this case, various materials can be used for forming a shunt resistor. Still another method for shunting the ramp-edge junction is to flatten the upper electrode 54 and the lower electrode 52 by removing the ramp climbing portion 55 of the upper electrode 54 and the interlayer insulating layer and to connect the flattened upper electrode 54 and lower electrode 52 by a resistance layer. In this case, a resistance value is controlled by the thickness of the resistance layer and contact resistance can be reduced by expanding areas where the resistance layer is in contact with the upper electrode 54 and the lower electrode 52.

The above resistance layers should be formed by the use of Pd which has suitable resistivity for a shunt resistor. Pd is a noble metal and is superior in oxidation resistance. Alternatively, a conductive material the oxide of which is an insulator may be used for forming the above resistance layers. For example, Ti used as resistors in conventional superconducting circuits may be used. This will improve controllability. To reduce contact resistance, buffer layers must be formed between the resistance layer and the upper electrode 54 and between the resistance layer and the lower electrode 52.

Still another method for shunting the ramp-edge junction is to use a conductive material for forming an underlayer on which the ramp-edge junction is formed by the use of an oxide high-temperature superconductor. This structure is suitable for forming a ground plane and a wiring layer over the ramp-edge junction. In this case, the shape of the conductive underlayer should correspond to the ramp-edge junction. In addition, the conductive underlayer should be formed on an insulating substrate 51 especially to fabricate various circuits.

Ramp-edge junctions according to fifth to twelfth embodiments of the present invention which are included in high-temperature superconducting junction devices having such a shunt structure will now be described. The following description will be given with surface-modified ramp-edge junctions as examples.

A surface-modified ramp-edge junction according to the fifth embodiment of the present invention will be described first with reference to FIG. 11.

Figure 11:
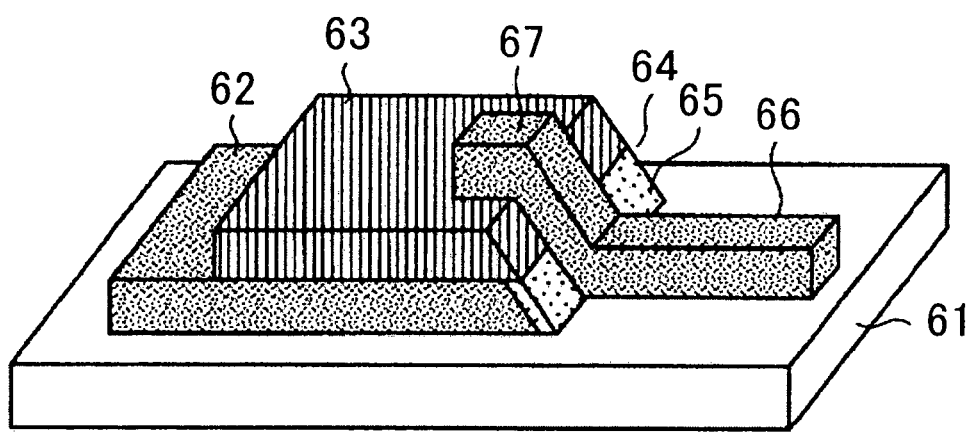
FIG. 11 is a rough perspective view of a ramp-edge junction according to a fifth embodiment of the present invention.

FIG. 11 is a rough perspective view of a ramp-edge junction according to the fifth embodiment of the present invention. First, a lower electrode 62 of La-doped YBCO ($YBa_2Cu_3O_{7-x}$) with a thickness of, for example, 200 nm and a conductive interlayer 63 of Nb-doped $SrTiO_3$ with a thickness of, for example, 300 nm are deposited in order on an MgO substrate 61 by pulse laser deposition (PLD). The amount of Nb contained in this Nb-doped $SrTiO_3$ is 0.001 wt %.

Then Ar-ion irradiation is performed with a resist pattern (not shown) as a mask so that each of the lower electrode 62 and the conductive interlayer 63 will have a predetermined shape. After that, Ar-ion irradiation is performed with a new resist pattern (not shown) as a mask so that the conductive interlayer 63 will have a predetermined shape.

By performing Ar-ion irradiation from an oblique direction with a new resist pattern (not shown) as a mask, exposed areas of the conductive interlayer 63 and the lower electrode 62 are etched and a ramp 64 is formed.

After the resist pattern is removed, Ar-ion irradiation is performed from a direction perpendicular to the substrate 61 to form a damaged layer 65 on the ramp 64.

After an upper electrode 66 of YBCO with a thickness of, for example, 200 nm is deposited on the whole surface by PLD, Ar-ion irradiation is performed with a resist pattern (not shown) having a predetermined shape as a mask to form the upper electrode 66 having a ramp climbing portion 67. As a result, the basic structure of the ramp-edge junction is completed. The width and length of the ramp climbing portion 67 are, for example, 5 and 3 µm respectively. Compared with a thin film of La-doped YBCO, a thin film of YBCO can be formed at a low temperature. Therefore, the influence of the process for forming the upper electrode 66 on the components, such as the lower electrode 62, which have already been formed can be reduced.

As stated above, with the ramp-edge junction according to the fifth embodiment of the present invention, shunt resistance is obtained only by changing the interlayer dielectric in the conventional ramp-edge structure to the conductive interlayer. Accordingly, without making a fundamental change in the conventional process, hysteresis can be made zero and stable circuit operation can be obtained. In addition, by selecting a critical current density value $J_c$ which minimizes the width of an SFQ pulse, a superconducting circuit can operate at a high speed.

A shunt resistance value in the ramp-edge junction according to the fifth embodiment of the present invention is controlled by the conductivity of the conductive interlayer 63, the thickness of the conductive interlayer 63, the size of the ramp climbing portion 67, or the like. However, the number of kinds of resistor materials which can be used in the ramp-edge junction according to the fifth embodiment of the present invention is small and this ramp-edge junction is suitable for a high-resistance shunt.

A surface-modified ramp-edge junction according to the sixth embodiment of the present invention will now be described with reference to FIG. 12.

Figure 12:
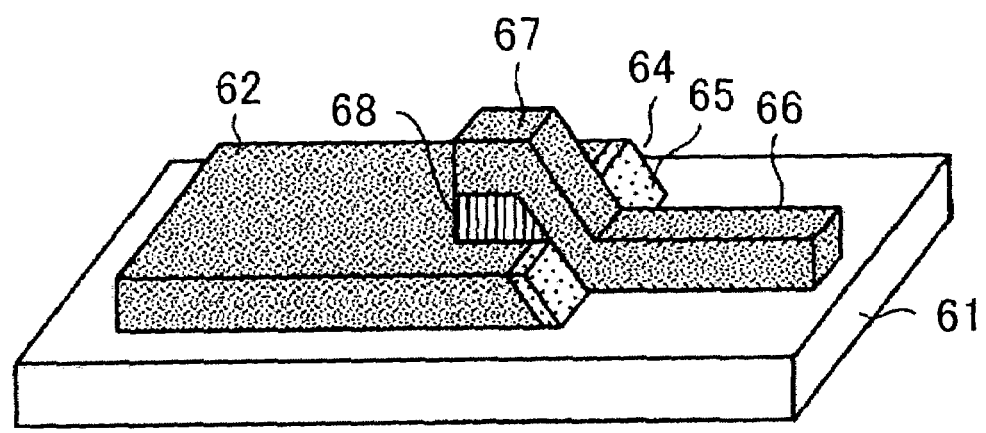
FIG. 12 is a rough perspective view of a ramp-edge junction according to a sixth embodiment of the present invention.

FIG. 12 is a rough perspective view of a ramp-edge junction according to the sixth embodiment of the present invention. First, a lower electrode 62 of La-doped YBCO ($YBa_2Cu_3O_{7-x}$) with a thickness of, for example, 200 nm and a conductive interlayer 68 of ITO with a thickness of, for example, 300 nm are deposited in order on an MgO substrate 61 by PLD. The amount of the dopant Sn contained in this ITO is 0.001 wt %.

Then Ar-ion irradiation is performed with a resist pattern (not shown) as a mask so that each of the lower electrode 62 and the conductive interlayer 68 will have a predetermined shape. After that, by performing Ar-ion irradiation from an oblique direction with a new resist pattern (not shown) as a mask, exposed areas of the conductive interlayer 68 and the lower electrode 62 are etched and a ramp 64 is formed.

After the resist pattern is removed, Ar-ion irradiation is performed from a direction perpendicular to the substrate 61 to form a damaged layer 65 on the ramp 64.

After an upper electrode 66 of YBCO with a thickness of, for example, 200 nm is deposited on the whole surface by PLD, Ar-ion irradiation is performed with a resist pattern (not shown) having a predetermined shape as a mask to form the upper electrode 66 having a ramp climbing portion 67. As a result, the basic structure of the ramp-edge junction is completed. The width and length of the ramp climbing portion 67 are, for example, 5 and 3 µm respectively.

Then an exposed area of the conductive interlayer 68 of ITO is etched and removed by performing Ar-ion irradiation. An ion milling rate for ITO is very great, so the conductive interlayer 68 can be etched without damaging the components, such as the lower electrode 62.

In the ramp-edge junction according to the sixth embodiment of the present invention, seen from above the conductive interlayer 68 has the same shape as the ramp climbing portion 67 as a result of self alignment. Therefore, the resistance value of a shunt resistor formed by the conductive interlayer 68 can be set more accurately.

A surface-modified ramp-edge junction according to the seventh embodiment of the present invention will now be described with reference to FIG. 13.

Figure 13:
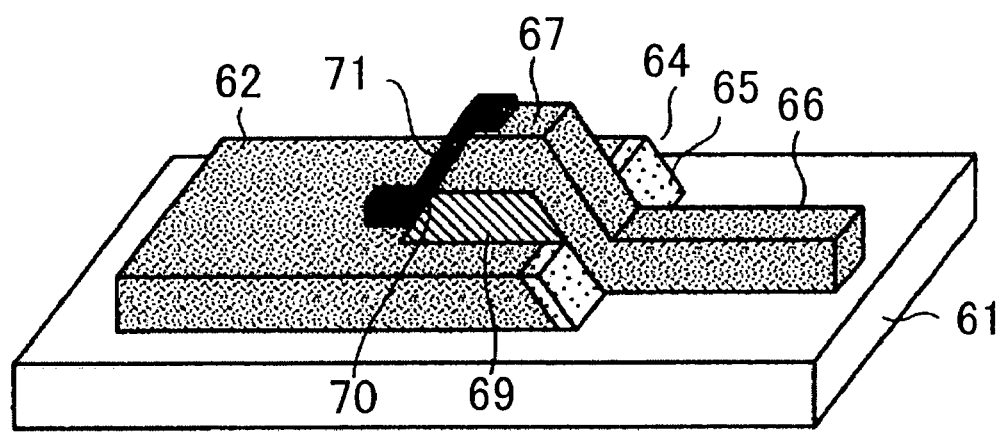
FIG. 13 is a rough perspective view of a ramp-edge junction according to a seventh embodiment of the present invention.

FIG. 13 is a rough perspective view of a ramp-edge junction according to the seventh embodiment of the present invention. First, a lower electrode 62 of La-doped YBCO ($YBa_2Cu_3O_{7-x}$) with a thickness of, for example, 200 nm and an interlayer dielectric 69 of $SrSnO_3$ with a thickness of, for example, 300 nm are deposited in order on an MgO substrate 61 by PLD. A good lattice match is obtained between $SrSnO_3$ and YBCO. Moreover, a crack is hard to appear on the interlayer dielectric 69 of $SrSnO_3$, compared with an interlayer dielectric of another material. As a result, the interlayer dielectric 69 of $SrSnO_3$ is superior in insulation and flatness.

Then Ar-ion irradiation is performed with a resist pattern (not shown) as a mask so that each of the lower electrode 62 and the interlayer dielectric 69 will have a predetermined shape. After that, by performing Ar-ion irradiation from an oblique direction with a new resist pattern (not shown) as a mask, exposed areas of the interlayer dielectric 69 and the lower electrode 62 are etched and a ramp 64 is formed.

After the resist pattern is removed, Ar-ion irradiation is performed from a direction perpendicular to the substrate 61 to form a damaged layer 65 on the ramp 64.

After an upper electrode 66 of YBCO with a thickness of, for example, 200 nm is deposited on the whole surface by PLD, Ar-ion irradiation is performed with a resist pattern (not shown) having a predetermined shape as a mask to form the upper electrode 66 having a ramp climbing portion 67. As a result, the basic structure of the ramp-edge junction is completed.

Then an exposed area of the interlayer dielectric 69 of $SrSnO_3$ is etched and removed by performing Ar-ion irradiation. At this time a slant 70 is formed on the side opposite to the ramp 64 by performing Ar-ion irradiation from an oblique direction.

Then a resistance layer 71 of Pd with a thickness of for example, 100 nm is formed on the slant 70 by mask deposition with a metal mask so that the ramp climbing portion 67 and the lower electrode 62 will be contact portions. As a result, the ramp-edge junction including a shunt resistor is completed.

As stated above, in the ramp-edge junction according to the seventh embodiment of the present invention, the resistance layer functions as the shunt resistor. Accordingly, various materials can be used for forming the shunt resistor. This ramp-edge junction is especially suitable for cases where a small resistance value is required. In this case, Pd is a noble metal and is superior in oxidation resistance. In addition, the resistivity of Pd is about ten times that of other noble metals, such as Au, so Pd is suitable for a resistor material.

A surface-modified ramp-edge junction according to the eighth embodiment of the present invention will now be described with reference to FIG. 14. This ramp-edge junction differs from the ramp-edge junction according to the seventh embodiment of the present invention only in the structure of a shunt resistor, so only the difference between them will be described.

Figure 14:
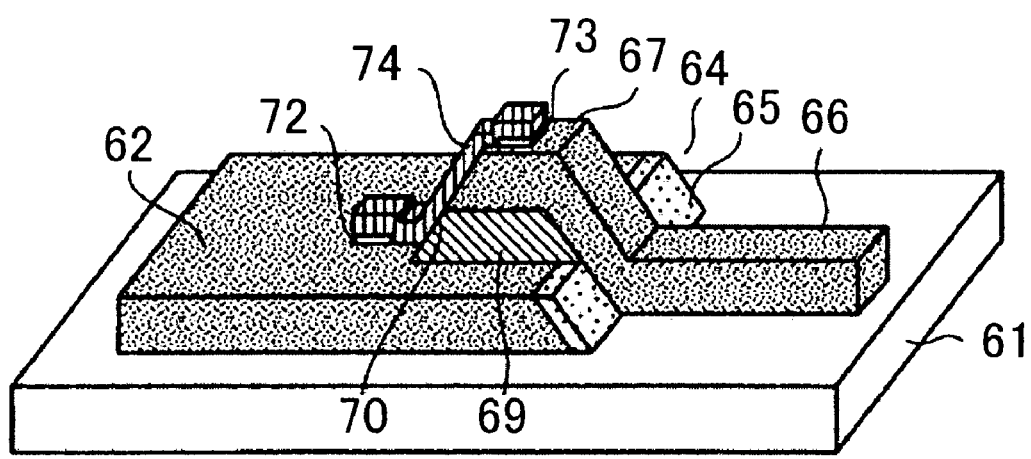
FIG. 14 is a rough perspective view of a ramp-edge junction according to an eighth embodiment of the present invention.

FIG. 14 is a rough perspective view of the ramp-edge junction according to the eighth embodiment of the present invention. An exposed area of an interlayer dielectric 69 of $SrSnO_3$ is etched and removed. A slant 70 is formed on the side opposite to a ramp 64. Contact layers 72 and 73 of Au with a thickness of, for example, 50 nm are formed by mask deposition with a metal mask.

Then a resistance layer 74 of Ti with a thickness of, for example, 100 nm is formed by mask deposition with a new metal mask so that it will cover the contact layers 72 and 73 and so that it will lie on the slant 70. As a result, the ramp-edge junction including the shunt resistor is completed.

As stated above, Ti widely used in conventional superconducting circuits as a resistor material is adopted in the ramp-edge junction according to the eighth embodiment of the present invention. Accordingly, this ramp-edge junction is easy to control and can be used as a shunt resistor with a resistance of several ohms. However, Ti is easy to oxidize. Therefore, as stated above, the contact layers 72 and 73 of a noble metal, such as Au, must be formed to suppress an increase in contact resistance.

A surface-modified ramp-edge junction according to the ninth embodiment of the present invention will now be described with reference to FIG. 15.

Figure 15:
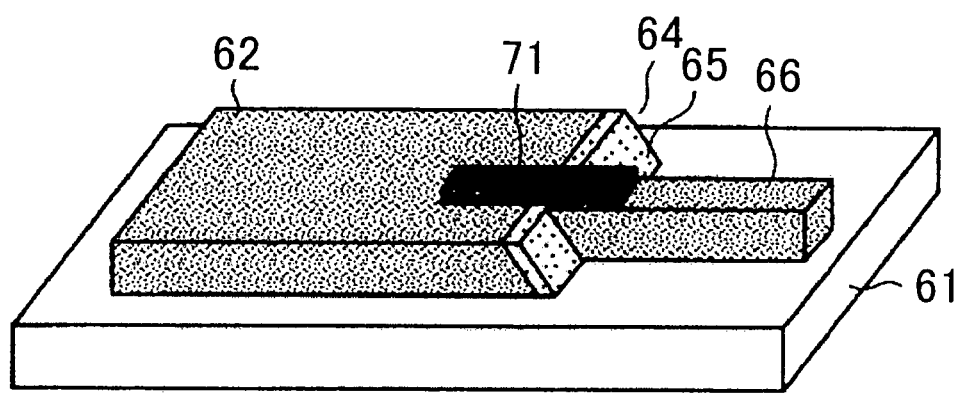
FIG. 15 is a rough perspective view of a ramp-edge junction according to a ninth embodiment of the present invention.

FIG. 15 is a rough perspective view of the ramp-edge junction according to the ninth embodiment of the present invention. First, a lower electrode 62 of La-doped YBCO ($YBa_2Cu_3O_{7-x}$) with a thickness of, for example, 200 nm is deposited on an MgO substrate 61 by PLD.

Then Ar-ion irradiation is performed with a resist pattern (not shown) as a mask so that the lower electrode 62 will have a predetermined shape. Furthermore, one end of the lower electrode 62 is irradiated with Ar ions from an oblique direction to form a ramp 64.

After the resist pattern is removed, Ar-ion irradiation is performed from a direction perpendicular to the substrate 61 to form a damaged layer 65 on the ramp 64.

After an upper electrode 66 of YBCO with a thickness of for example, 200 nm is deposited on the whole surface by PLD, Ar-ion irradiation is performed with a resist pattern (not shown) having a predetermined shape as a mask to form the upper electrode 66 having a ramp climbing portion (not shown).

Then mechanical polishing is performed with $Al_2O_3$ particles to completely remove the ramp climbing portion formed on the lower electrode 62 and to flatten the surface.

Then a resistance layer 71 of Pd with a thickness of, for example, 100 nm is formed by mask deposition with a metal mask so that it will lie on the lower electrode 62 and the upper electrode 66. As a result, the ramp-edge junction including a shunt resistor is completed.

As stated above, in the ramp-edge junction according to the ninth embodiment of the present invention, a resistance value is controlled by the thickness of the resistance layer 71 and contact resistance can be reduced by increasing the area of contacts.

A surface-modified ramp-edge junction according to the tenth embodiment of the present invention will now be described with reference to FIG. 16. This ramp-edge junction differs from the ramp-edge junction according to the ninth embodiment of the present invention only in the structure of a shunt resistor, so only the difference between them will be described.

Figure 16:
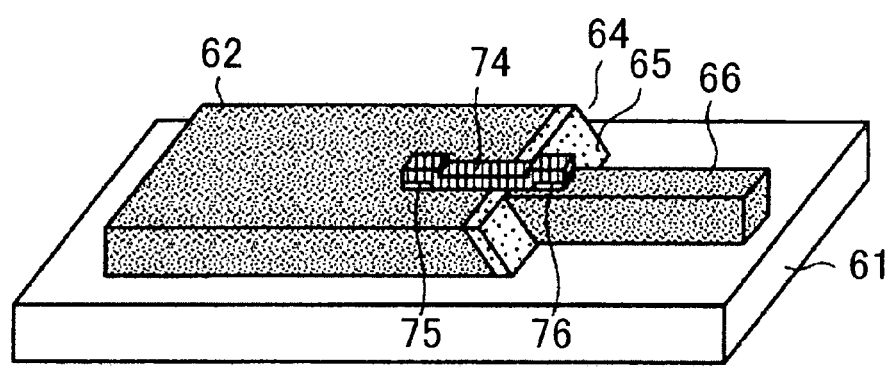
FIG. 16 is a rough perspective view of a ramp-edge junction according to a tenth embodiment of the present invention.

FIG. 16 is a rough perspective view of the ramp-edge junction according to the tenth embodiment of the present invention. Mechanical polishing is performed with $Al_2O_3$ particles to completely remove a ramp climbing portion formed on a lower electrode 62 and to flatten the surface. Then contact layers 75 and 76 of Ag with a thickness of, for example, 50 nm is formed by mask deposition with a metal mask.

Then a resistance layer 74 of Ti with a thickness of, for example, 100 nm is formed by mask deposition with a new metal mask so that it will cover the contact layers 75 and 76 and so that it will lie on the lower electrode 62 and an upper electrode 66. As a result, the ramp-edge junction including the shunt resistor is completed.

As stated above, Ti widely used in conventional superconducting circuits as a resistor material is adopted in the ramp-edge junction according to the tenth embodiment of the present invention. This is the same with the ramp-edge junction according to the eighth embodiment of the present invention. Accordingly, this ramp-edge junction is easy to control and can be used as a shunt resistor with a resistance of several ohms.

A surface-modified ramp-edge junction according to the eleventh embodiment of the present invention will now be described with reference to FIG. 17.

Figure 17:
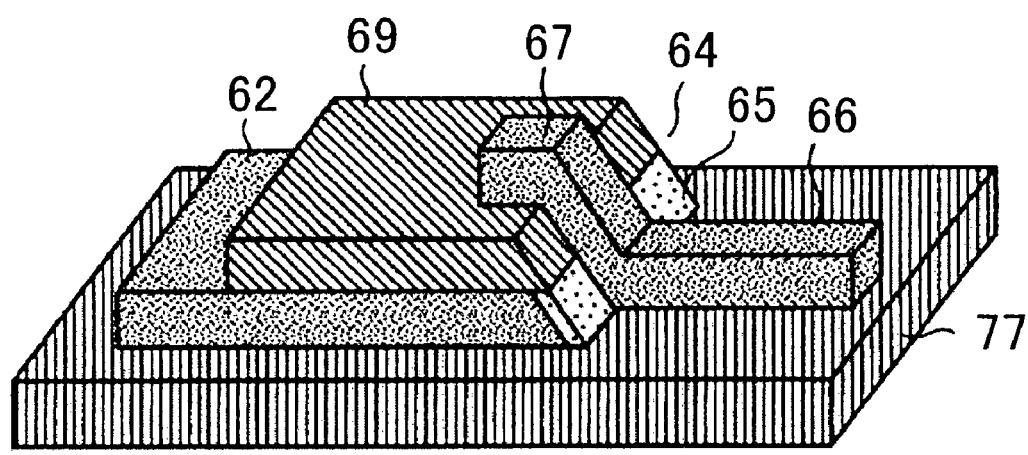
FIG. 17 is a rough perspective view of a ramp-edge junction according to an eleventh embodiment of the present invention.

FIG. 17 is a rough perspective view of the ramp-edge junction according to the eleventh embodiment of the present invention. First, a lower electrode 62 of La-doped YBCO ($YBa_2Cu_3O_{7-x}$) with a thickness of, for example, 200 nm and an interlayer dielectric 69 of $SrSnO_3$ with a thickness of, for example, 300 nm are deposited in order on a conductive substrate 77 of Nb-doped $SrTiO_3$ (the amount of the dopant Nb contained in this $SrTiO_3$ is 0.001 wt %) by PLD.

Then Ar-ion irradiation is performed with a resist pattern (not shown) as a mask so that each of the lower electrode 62 and the interlayer dielectric 69 will have a predetermined shape. After that, Ar-ion irradiation is performed with a new resist pattern (not shown) as a mask so that the interlayer dielectric 69 will have a predetermined shape.

By performing Ar-ion irradiation from an oblique direction with a new resist pattern (not shown) as a mask, exposed areas of the interlayer dielectric 69 and the lower electrode 62 are etched and a ramp 64 is formed.

After the resist pattern is removed, Ar-ion irradiation is performed from a direction perpendicular to the substrate 77 to form a damaged layer 65 on the ramp 64.

After an upper electrode 66 of YBCO with a thickness of, for example, 200 nm is deposited on the whole surface by PLD, Ar-ion irradiation is performed with a resist pattern (not shown) having a predetermined shape as a mask to form the upper electrode 66 having a ramp climbing portion 67. As a result, the ramp-edge junction including a shunt resistor is completed. The width and length of the ramp climbing portion 67 are, for example, 5 and 3 µm respectively.

The ramp-edge junction according to the eleventh embodiment of the present invention differs from conventional ramp-edge junctions only in substrate. Accordingly, the ramp-edge junction including the shunt resistor can be fabricated without significantly changing the whole structure or the fabrication process. Such a ramp-edge junction is suitable for forming a ground plane or a wiring layer over it.

A shunt resistance value in this ramp-edge junction should be determined by the thickness of the conductive substrate 77 or the amount of the dopant. However, the number of kinds of resistor materials which can be used in the ramp-edge junction according to the eleventh embodiment of the present invention is small. This is the same with the ramp-edge junction according to the fifth embodiment of the present invention. With a high-frequency signal, a current path is shut off by impedance. Therefore, the current will flow only into a bordering area and will not diffuse.

A surface-modified ramp-edge junction according to the twelfth embodiment of the present invention will now be described with reference to FIG. 18. The basic structure of the ramp-edge junction according to the twelfth embodiment of the present invention is the same as that of the ramp-edge junction according to the eleventh embodiment of the present invention. In the ramp-edge junction according to the eleventh embodiment of the present invention, circuit structure is limited by the conductive substrate. Therefore, in the ramp-edge junction according to the twelfth embodiment of the present invention, a conductive layer which functions as a shunt resistor is formed on an insulating substrate as an insular area.

Figure 18:
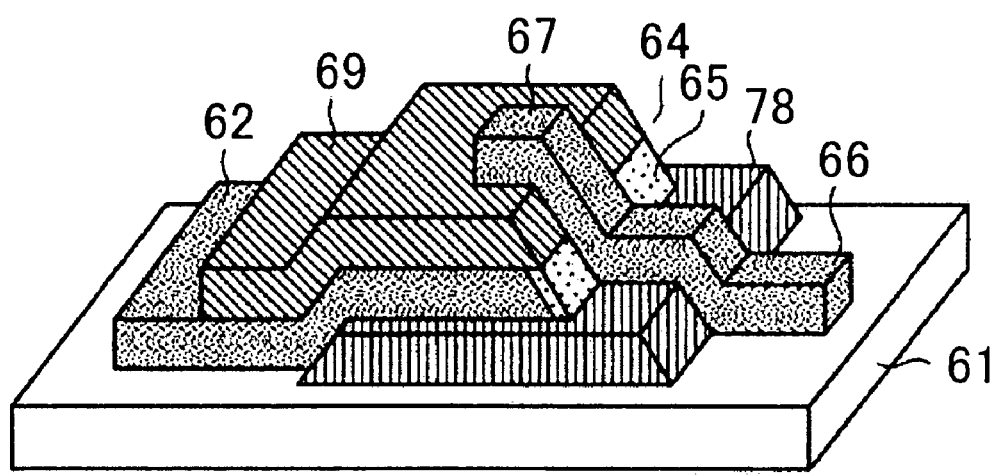
FIG. 18 is a rough perspective view of a ramp-edge junction according to a twelfth embodiment of the present invention.
Figure 19:
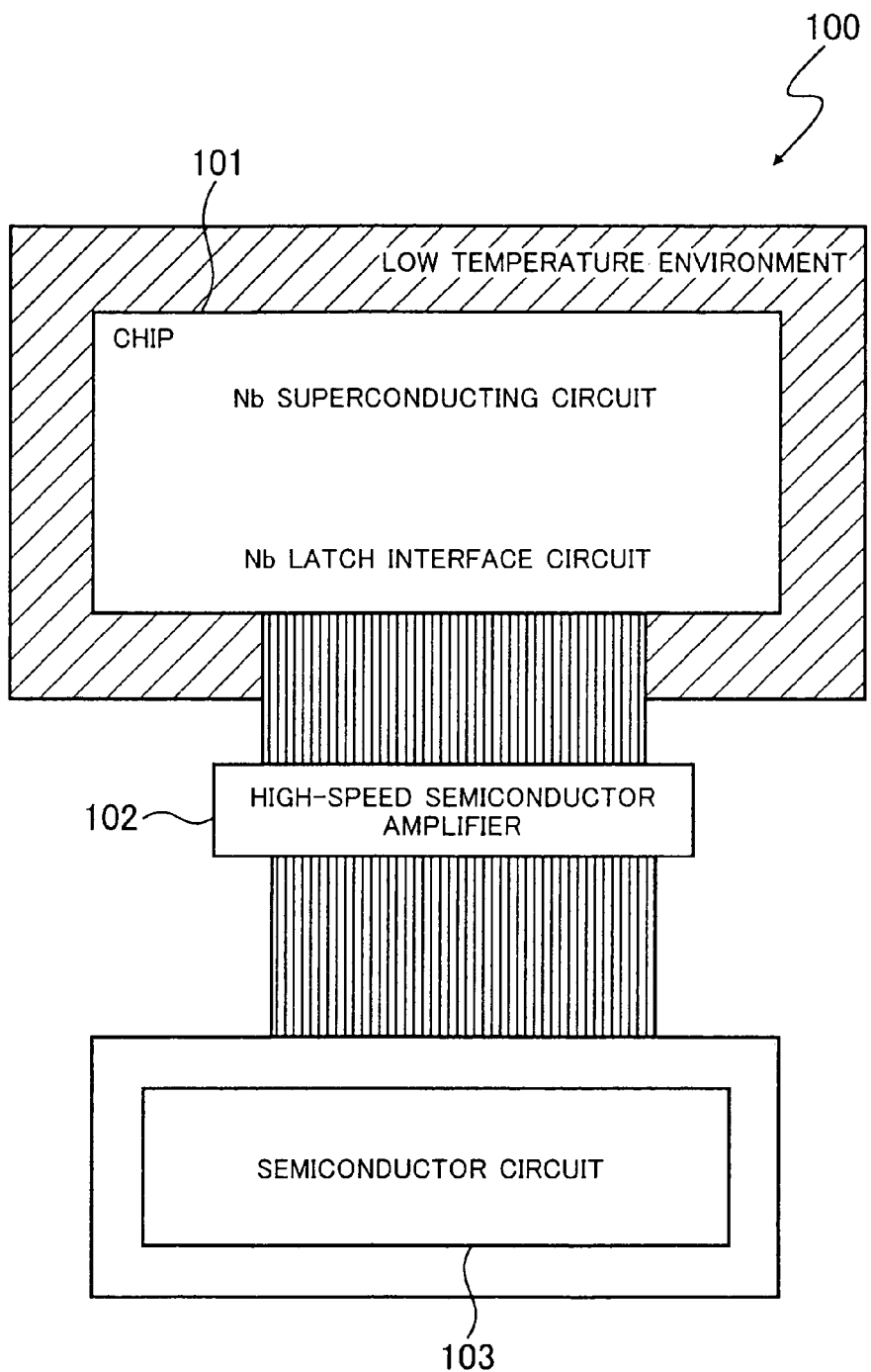
FIG. 19 shows an example of the structure of a conventional superconducting system in which a metal superconductor is used.
Figure 20A:
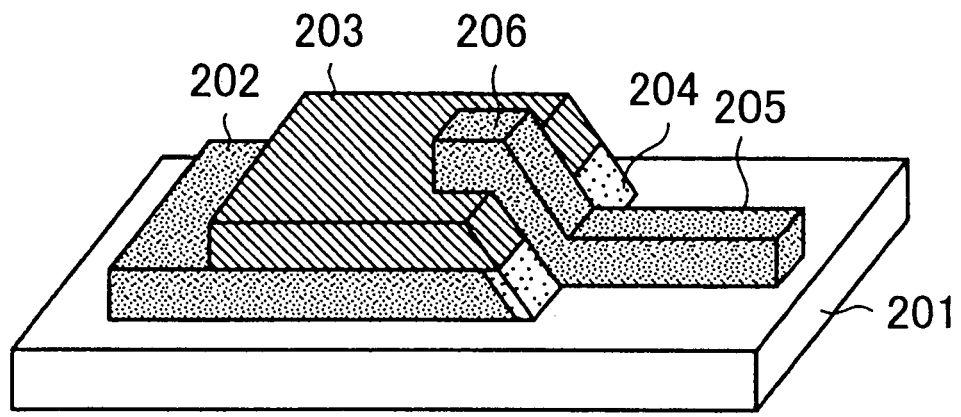
Figure 20B:
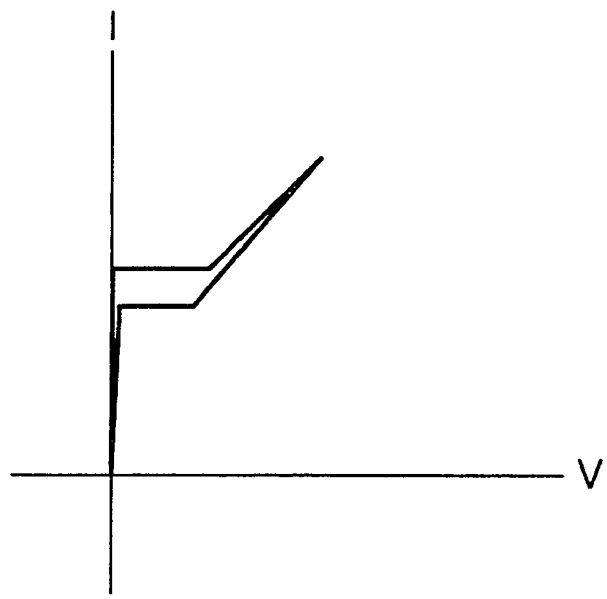
FIG. 20B shows the volt-ampere characteristic of the ramp-edge junction.
Figure 21:
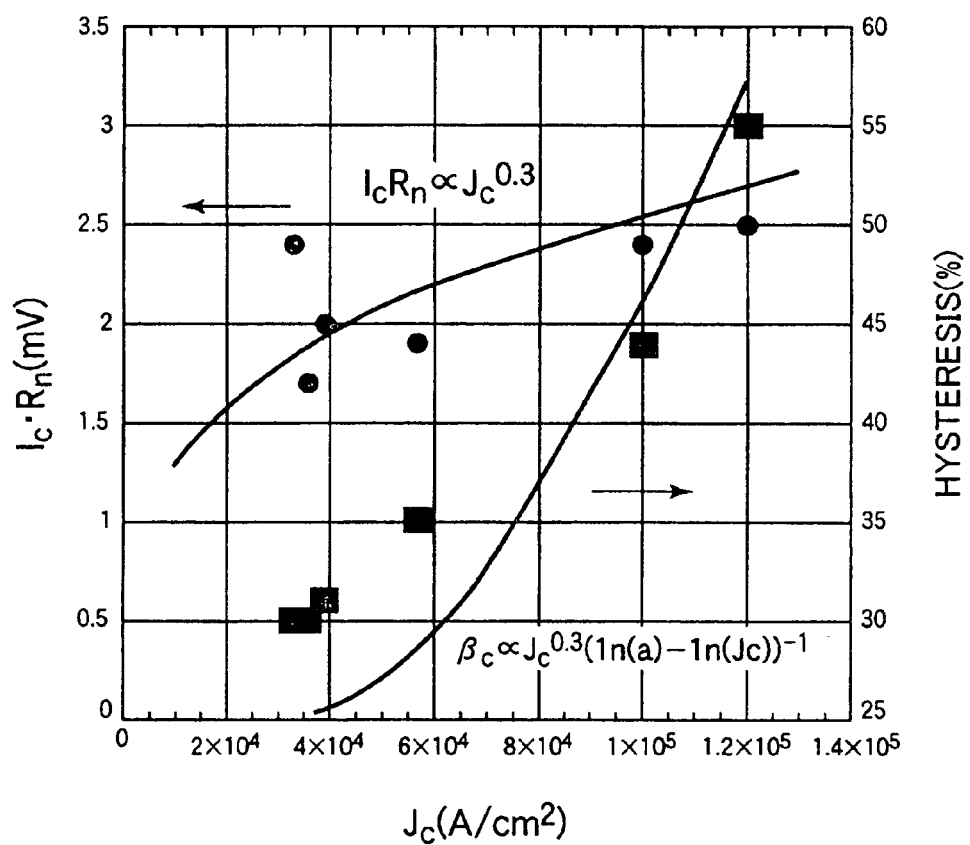
FIG. 21 is a view for describing the dependence of an $I_c$—$R_n$ product and hysteresis for a conventional high-temperature superconducting ramp-edge junction on critical current density $J_c$.

FIG. 18 is a rough perspective view of the ramp-edge junction according to the twelfth embodiment of the present invention. First, a conductive layer 78 of Sn-doped ITO (the amount of the dopant Sn contained in this ITO is 1 wt %) with a thickness of, for example, 100 nm is deposited on an MgO substrate 61 by PLD. Ar-ion irradiation is performed with a resist pattern (not shown) as a mask to make the conductive layer 78 an insular area.

Then a lower electrode 62 of La-doped YBCO ($YBa_2Cu_3O_{7-x}$) with a thickness of, for example, 200 nm and an interlayer dielectric 69 of $SrSnO_3$ with a thickness of, for example, 300 nm are deposited in order by PLD.

Ar-ion irradiation is performed with a resist pattern (not shown) as a mask so that each of the lower electrode 62 and the interlayer dielectric 69 will have a predetermined shape.

By doing so, part of the conductive layer 78 is exposed at one end of each of the lower electrode 62 and the interlayer dielectric 69 at least. After that, Ar-ion irradiation is performed with a new resist pattern (not shown) as a mask so that the interlayer dielectric 69 will have a predetermined shape.

By performing Ar-ion irradiation from an oblique direction with a new resist pattern (not shown) which exposes the above one end of each of the lower electrode 62 and the interlayer dielectric 69 as a mask, exposed areas of the interlayer dielectric 69 and the lower electrode 62 are etched and a ramp 64 is formed.

After the resist pattern is removed, Ar-ion irradiation is performed from a direction perpendicular to the substrate 61 to form a damaged layer 65 on the ramp 64.

After an upper electrode 66 of YBCO with a thickness of, for example, 200 nm is deposited on the whole surface by PLD, Ar-ion irradiation is performed with a resist pattern (not shown) having a predetermined shape as a mask to form the upper electrode 66 having a ramp climbing portion 67. As a result, the ramp-edge junction including a shunt resistor is completed. The width and length of the ramp climbing portion 67 are, for example, 5 and 3 µm respectively.

In the ramp-edge junction according to the twelfth embodiment of the present invention, the conductive layer 78 formed as an insular area functions as the shunt resistor. Therefore, even if a ground plane and a wiring layer are formed over the ramp-edge junction, various circuits can be formed at will.

The ramp-edge junctions according to the fifth to twelfth embodiments of the present invention have been described. However, the present invention is not limited to the structure and conditions described in these embodiments and various modifications are possible.

For example, in the above embodiments the descriptions have been given with the surface-modified ramp-edge junctions as examples. However, the present invention is not limited to a surface-modified ramp-edge junction. It is a matter of course that the present invention is applicable to a ramp-edge junction in which a barrier layer is formed by deposition. In this case, the barrier layer should be formed by the use of PBCO ($PrBa_2Cu_3O_{7-x}$), or the like.

Furthermore, in the above embodiments the lower electrode and the upper electrode are formed by the use of La-doped YBCO ($YBa_2Cu_3O_{7-x}$) and YBCO, respectively, with film formation temperatures taken into consideration. However, both the lower electrode and the upper electrode may be formed by the use of La-doped YBCO or YBCO.

Moreover, the lower electrode and the upper electrode may be formed by the use of $REBa_2Cu_3O_{7-x}$. RE in $REBa_2Cu_3O_{7-x}$ indicates one or more of lanthanoids excluding Pr and Ce. RE, Ba, and Cu are contained in $REBa_2Cu_3O_{7-x}$ in the ratio of 1:2:3.

In the above embodiments, the interlayer dielectric is formed by the use of $SrSnO_3$ superior in insulation and flatness. However, LAST ($[LaAlO_3]_{0.3}[Sr(Al,Ta)O_3]_{0.7}$), MgO, $CeO_2$, $SrTiO_3$, or the like may be used in place of $SrSnO_3$.

In the fifth and eleventh embodiments, Nb-doped $SrTiO_3$ is used for forming the conductive interlayer or as the conductive substrate. However, ITO may be used in place of Nb-doped $SrTiO_3$.

In the sixth and twelfth embodiments, ITO an ion milling rate for which is great is used for forming the conductive interlayer or the conductive layer. However, Nb-doped $SrTiO_3$ may be used in place of ITO.

In the eighth embodiment, Au is used for forming the contact layers. In the tenth embodiment, Ag is used for forming the contact layers. In the eighth and tenth embodiments, however, either of them may be used.

In the above embodiments, the insulating substrate of MgO is used. However, an insulating substrate of LAST ($[LaAlO_3]_{0.3}$ $[Sr(Al,Ta)O_3]_{0.7}$), $SrTiO_3$, or the like may be used.

In the above embodiments, the YBCO film and the $SrSnO_3$ film are deposited by pulse laser deposition. However, sputtering may be used in place of pulse laser deposition.

In the above embodiments, the ramp is irradiated with Ar ions to form the damaged layer. However, another kind of rare gas ions, such as Ne, Kr, or Xe ions, may be used in place of Ar ions.

In the above embodiments, no mention is made of uses for superconducting circuits including the ramp-edge junction with the shunt resistor. However, they will be used in the fields of communication, computer, and instrumentation as communication routers, servers, A/D converters, SQUIDs, samplers, and the like.

As has been described in the foregoing, the superconducting system according to the present invention comprises a low-temperature superconducting circuit having a Josephson junction formed by the use of a metal superconductor and an interface circuit having a Josephson junction formed by the use of an oxide high-temperature superconductor. As a result, the superconducting system which can transmit a signal outputted from the low-temperature superconducting circuit to another circuit via the interface circuit at a high speed with a small amount of energy can be realized.

Furthermore, by forming a low-temperature superconducting circuit having a Josephson junction formed by the use of a metal superconductor and an interface circuit having a Josephson junction formed by the use of an oxide high-temperature superconductor on a superconducting circuit chip, a signal outputted from the low-temperature superconducting circuit can be transmitted to another circuit at a high speed.

In addition, in the present invention the ramp-edge junction formed by the use of an oxide high-temperature superconductor is shunted by a shunt resistor. Therefore, superconducting junctions which can operate at high speeds greater than or equal to 20 GHz and which will be useful in the fields of communication, computer, and instrumentation can be provided and the present invention will contribute greatly to the development of superconducting systems in which an oxide high-temperature superconductor is used.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A high-temperature superconducting junction device with a shunt resistor comprising:
    a lower electrode which has a ramp at an edge, and which is formed of an oxide high-temperature superconductor,
    a barrier layer formed on the ramp and formed only in the ramp area,
    a conductive interlayer formed on the lower electrode,
    an upper electrode which has a first portion disposed in the ramp side of the lower electrode with the barrier layer between and formed immediately on the barrier layer and a second portion climbed over the conductive interlayer and formed on the conductive interlayer, and which is formed of an oxide high-temperature superconductor.

2. The high-temperature superconducting junction device with a shunt resistor according to claim 1, wherein the conductive interlayer is partially formed on the lower electrode, and seen from above the shape of the conductive interlayer is the same as the shape of the second portion.

* * * * *